US012616017B2

(12) United States Patent (10) Patent No.: US 12,616,017 B2
Huang et al. (45) Date of Patent: Apr. 28, 2026

(54) SEMICONDUCTOR DEVICE AND METHOD

(71) Applicant: Taiwan Semiconductor Manufacturing Co., Ltd., Hsinchu (TW)

(72) Inventors: Ching-Yu Huang, Hsinchu (TW); Ting-Chu Ko, Hsinchu (TW); Der-Chyang Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 477 days.

(21) Appl. No.: 18/151,008

(22) Filed: Jan. 6, 2023

(65) Prior Publication Data

US 2024/0162119 A1     May 16, 2024

Related U.S. Application Data

(60) Provisional application No. 63/424,721, filed on Nov. 11, 2022.

(51) Int. Cl.
H01L 23/48      (2006.01)
H01L 21/311     (2006.01)
(Continued)

(52) U.S. Cl.
CPC ...... H01L 23/481 (2013.01); H01L 21/31144 (2013.01); H01L 21/76831 (2013.01);
(Continued)

(58) Field of Classification Search
CPC ............. H01L 23/481; H01L 21/31144; H01L 21/76831; H01L 21/76871
See application file for complete search history.

(56) References Cited

U.S. PATENT DOCUMENTS 7,169,694 B2 *   1/2007  Pozder ................... H01L 24/03
                                                   257/E21.582
9,601,446 B2 *   3/2017  Jeng ........................ H01L 24/03
                    (Continued)

FOREIGN PATENT DOCUMENTS

CN        109216209 A  *  1/2019  ............. H01L 22/20
CN        109216209 B  *  11/2020  ............. H10D 84/01
                    (Continued)

*Primary Examiner* — Laura M Menz

(74) *Attorney, Agent, or Firm* — Slater Matsil, LLP

(57) ABSTRACT

An embodiment is a method including forming a first interconnect structure over a first substrate, the first interconnect structure including dielectric layers and metallization patterns therein, the metallization patterns including a top metal layer including top metal structures, forming a passivation layer over the top metal structures of the first interconnect structure, forming a first opening through the passivation layer, forming a probe pad in the first opening and over the passivation layer, the probe pad being electrically connected to the first top metal structure, performing a circuit probe test on the probe pad, removing the probe pad, and forming a bond pad and a bond via in dielectric layers over the passivation layer, the bond pad and bond via being electrically coupled to a second top metal structure of the top metal structures and a third top metal structure of the top metal structures.

18 Claims, 27 Drawing Sheets

(51) Int. Cl.
   *H01L 21/66* (2006.01)
   *H01L 21/768* (2006.01)
   *H01L 23/00* (2006.01)
(52) U.S. Cl.
   CPC .. *H01L 21/76871* (2013.01); *H01L 21/76877* (2013.01); *H01L 21/76898* (2013.01); *H01L 22/32* (2013.01); *H01L 24/05* (2013.01); *H01L 2224/05009* (2013.01)

(56) References Cited

U.S. PATENT DOCUMENTS

| | | | | |
|---|---|---|---|---|
| 9,633,955 | B1 * | 4/2017 | Huang | H01L 23/528 |
| 10,276,441 | B2 * | 4/2019 | Lee | H10F 39/8063 |
| 10,510,606 | B2 * | 12/2019 | Lee | H10F 39/811 |
| 10,879,123 | B2 * | 12/2020 | Lee | H01L 22/32 |
| 11,227,837 | B2 * | 1/2022 | Yu | H01L 21/4853 |
| 11,450,579 | B2 * | 9/2022 | Liu | H01L 23/49822 |
| 11,532,524 | B2 * | 12/2022 | Liu | G01R 31/2884 |
| 11,635,566 | B2 * | 4/2023 | Tai | G02B 6/12004 |
| | | | | 385/14 |
| 11,756,907 | B2 | 9/2023 | Chen et al. | |
| 12,327,815 | B2 * | 6/2025 | Yeh | H01L 25/0652 |
| 2005/0014356 | A1 * | 1/2005 | Pozder | H01L 24/11 |
| | | | | 257/E21.582 |
| 2009/0026621 | A1 * | 1/2009 | Poddar | H01L 24/48 |
| | | | | 257/760 |
| 2017/0053844 | A1 * | 2/2017 | Tsai | H01L 25/04 |
| 2017/0194273 | A1 * | 7/2017 | Chen | H01L 24/05 |
| 2018/0342552 | A1 * | 11/2018 | Ho | H10F 39/18 |
| 2019/0006237 | A1 * | 1/2019 | Lee | H01L 23/3114 |
| 2019/0252257 | A1 * | 8/2019 | Lee | H10F 39/026 |
| 2020/0075416 | A1 * | 3/2020 | Lee | H10F 39/802 |
| 2020/0144160 | A1 * | 5/2020 | Hu | H01L 23/481 |
| 2021/0210395 | A1 * | 7/2021 | Liu | H01L 24/11 |
| 2021/0358854 | A1 * | 11/2021 | Yu | H01L 23/5389 |
| 2022/0028748 | A1 * | 1/2022 | Liu | H01L 22/20 |
| 2022/0367374 | A1 * | 11/2022 | Yu | H01L 23/5383 |
| 2023/0095134 | A1 * | 3/2023 | Chen | H01L 25/50 |
| | | | | 257/668 |
| 2023/0307417 | A1 * | 9/2023 | Chen | H01L 25/105 |
| 2023/0335534 | A1 * | 10/2023 | Yeh | H01L 25/50 |
| 2024/0047417 | A1 * | 2/2024 | Yeh | H01L 24/80 |
| 2024/0162119 | A1 * | 5/2024 | Huang | H01L 24/03 |
| 2024/0413012 | A1 * | 12/2024 | Liu | H01L 24/80 |
| 2025/0029946 | A1 * | 1/2025 | Kuo | H01L 24/14 |
| 2025/0081600 | A1 * | 3/2025 | Lee | H01L 24/05 |
| 2025/0140667 | A1 * | 5/2025 | Chang | H01L 23/49816 |
| 2025/0266396 | A1 * | 8/2025 | Yeh | H01L 24/08 |

FOREIGN PATENT DOCUMENTS

| | | | | | |
|---|---|---|---|---|---|
| CN | 113658932 | A | * | 11/2021 | H01L 21/4814 |
| CN | 116487353 | A | * | 7/2023 | H01L 24/08 |
| CN | 117637603 | A | * | 3/2024 | H01L 23/5283 |
| CN | 118712075 | A | * | 9/2024 | H01L 23/485 |
| DE | 102024100986 | A1 | * | 12/2024 | G01R 31/2886 |
| DE | 102024105151 | A1 | * | 4/2025 | H01L 23/5283 |
| KR | 20170022825 | A | * | 3/2017 | H01L 21/76898 |
| KR | 20190003318 | A | * | 1/2019 | H01L 23/50 |
| KR | 102110283 | B1 | * | 5/2020 | H01L 22/32 |
| KR | 20240174998 | A | * | 12/2024 | G01R 31/2886 |
| TW | 202123413 | A | | 6/2021 | |
| TW | 202125746 | A | | 7/2021 | |
| TW | 202134713 | A | | 9/2021 | |
| TW | 202420501 | A | * | 5/2024 | H01L 21/76871 |
| TW | 202449906 | A | * | 12/2024 | H01L 21/76831 |

* cited by examiner

SEMICONDUCTOR DEVICE AND METHOD

PRIORITY CLAIM AND CROSS-REFERENCE

This application claims the benefit of U.S. Provisional Application No. 63/424,721 filed on Nov. 11, 2022, entitled "Semiconductor Device and Method," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
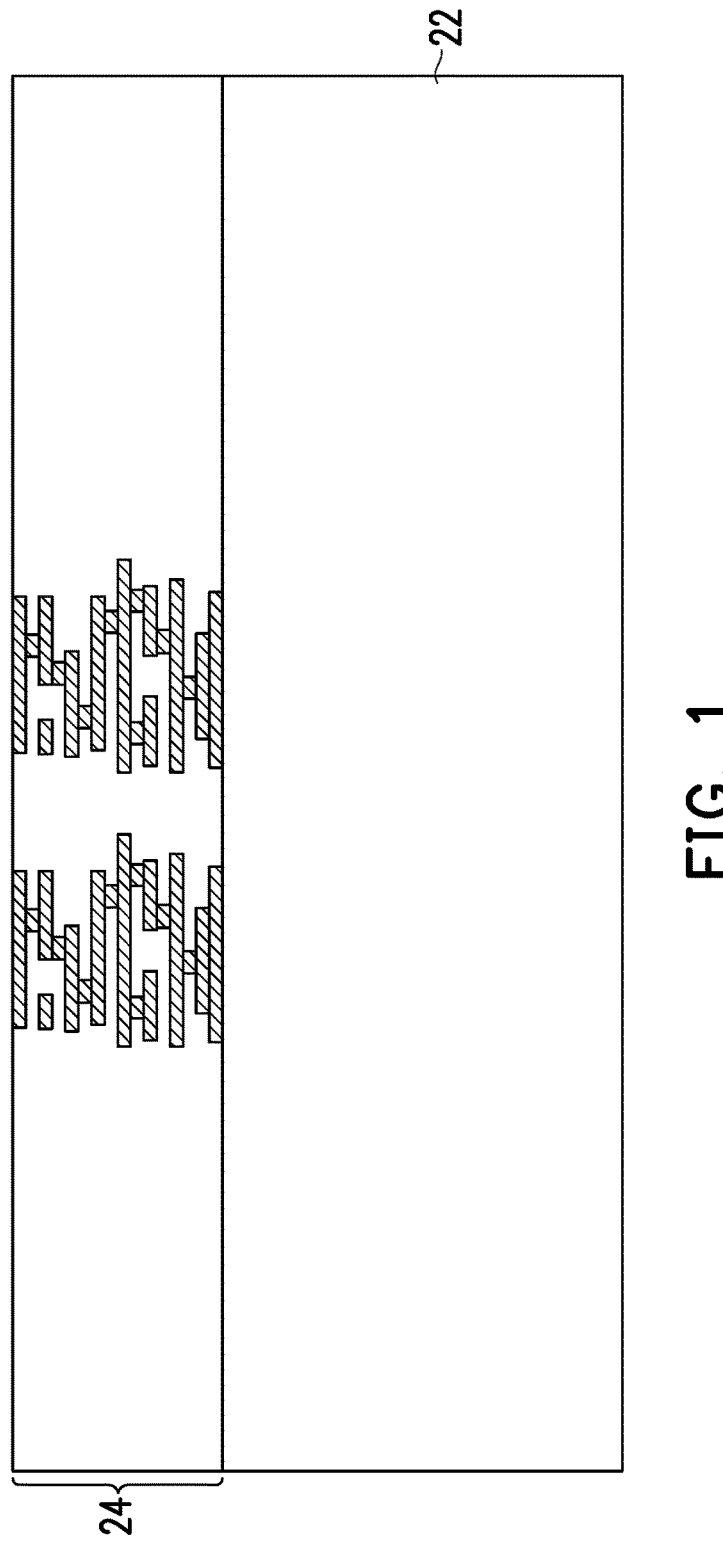
FIGS. 1 through 25 illustrate cross-sectional views and a plan view of intermediate stages in the formation of a package according to an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely an interconnect structure with a sacrificial probe pad that can be integrated into a device (e.g., a chip or die) or a package (e.g., system on integrated chip (SoIC), a chip-on-wafer (CoW) package structure, or a wafer-on-wafer (WoW) package structure). The interconnect structure includes sacrificial probe pad to allow intermediate testing of the chip or device for known good die integration while increasing the area for interconnect routing. In some embodiments, the sacrificial probe pad is formed of a material that can be removed after the testing is performed so that underlying metallization layers can be reached by conductive vias. In related structures, the probe pad is not removable and the underlying area it is not reachable by conductive vias such that the underlying area is not used for interconnect routing but is unutilized space of the interconnect. By having probe pad be removable, the routing area of the interconnect can be increase by up to 10% for a single chip or die.

Further, the teachings of this disclosure are applicable to any interconnect structure with a removable probe pad that can increase the routing area of the interconnect and/or redistribution structure. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 25 illustrate cross-sectional views and a plan view of intermediate stages in the formation of packages in accordance with some embodiments.

FIG. 1 illustrates a cross-sectional view of an integrated circuit die 20 in accordance with some embodiments. The integrated circuit die 20 will be packaged in subsequent processing to form an integrated circuit package. The integrated circuit die 20 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 20 may be formed in a wafer, which may include different device regions that are singulated in subsequent steps to form a plurality of integrated circuit dies. The integrated circuit die 20 may be processed according to applicable manufacturing processes to form integrated circuits. For example, the integrated circuit die 20 includes a substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices (not shown) may be formed at the front surface of the substrate 22. The devices may be active devices (e.g., transistors, diodes, etc.), capacitors, resistors, the like, or a combination thereof. An inter-layer dielectric (ILD) (not separately illustrated) is over the front surface of the substrate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An interconnect structure 24 is over the ILD and the conductive plugs. The interconnect structure 24 interconnects the devices to form an integrated circuit. The interconnect structure 24 may be formed by, for example, metallization patterns in dielectric layers on the ILD. The metallization patterns include metal lines and vias formed in one or more low-k dielectric layers. The metallization patterns of the interconnect structure 24 are electrically coupled to the devices by the conductive plugs. The metallization patterns may be formed using any suitable process, such as a single damascene process, a dual damascene process, a plating process, combinations thereof, or the like.

Figure 2:
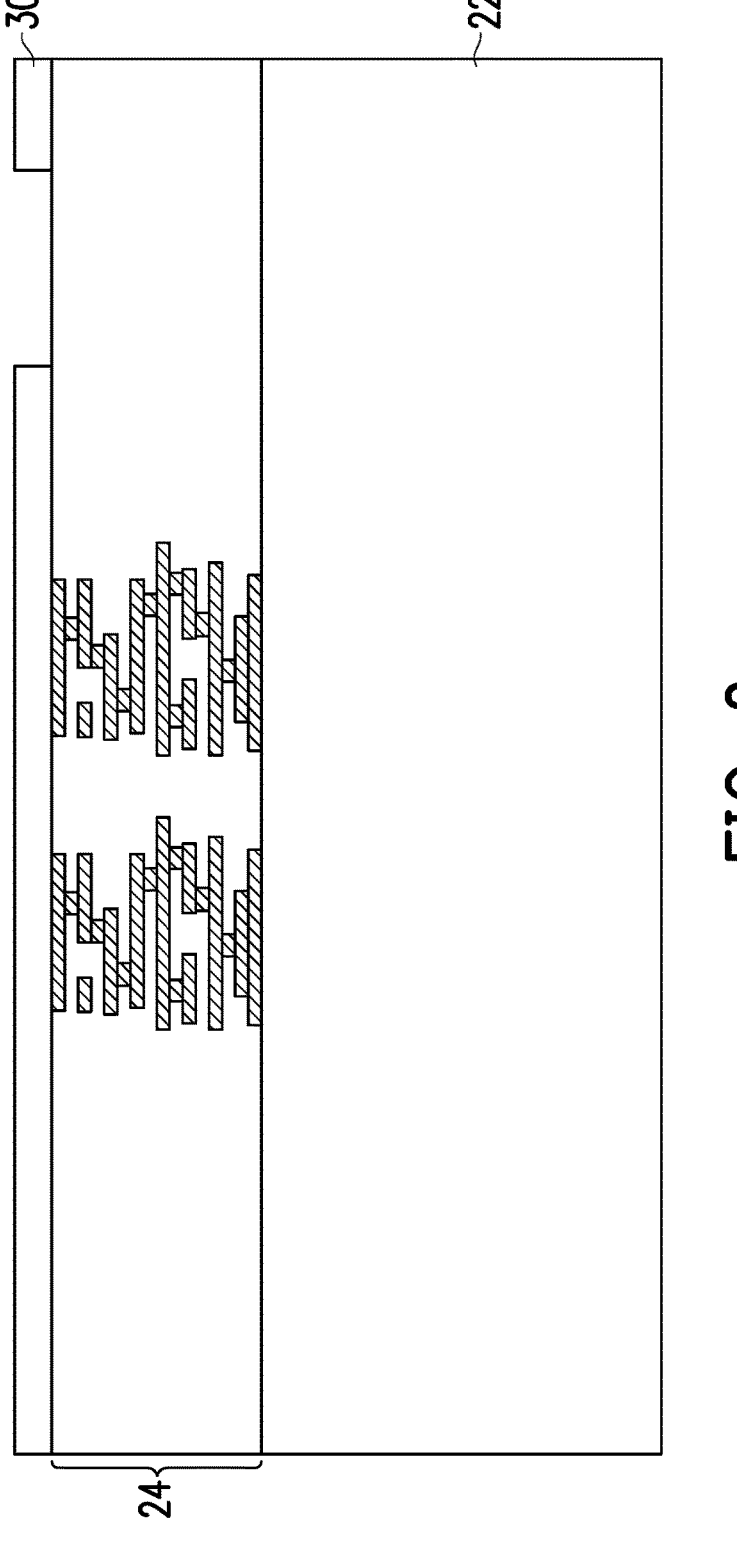

After forming the interconnect structure 24, as shown in FIG. 2, a mask 30 is formed and patterned on the interconnect structure 23. In some embodiments, the mask 30 is a photoresist and may be formed by spin coating or the like and may be exposed to light for patterning. The pattern of the photoresist corresponds to an upper portion of the subsequently formed through substrate via (TSV) 44 (see, e.g., FIG. 6). The patterning forms at least one opening through the photoresist 30 to expose the interconnect structure 24. In some embodiments, a stop layer (not shown), such as a chemical mechanical polishing (CMP) stop layer is deposited over a top surface of the interconnect structure 24 before the mask 30. The CMP stop layer may be used to prevent a subsequent CMP process from removing too much material by being resistant to the subsequent CMP process and/or by providing a detectable stopping point for the subsequent CMP process. In some embodiments, the CMP stop layer may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof.

Figure 3:
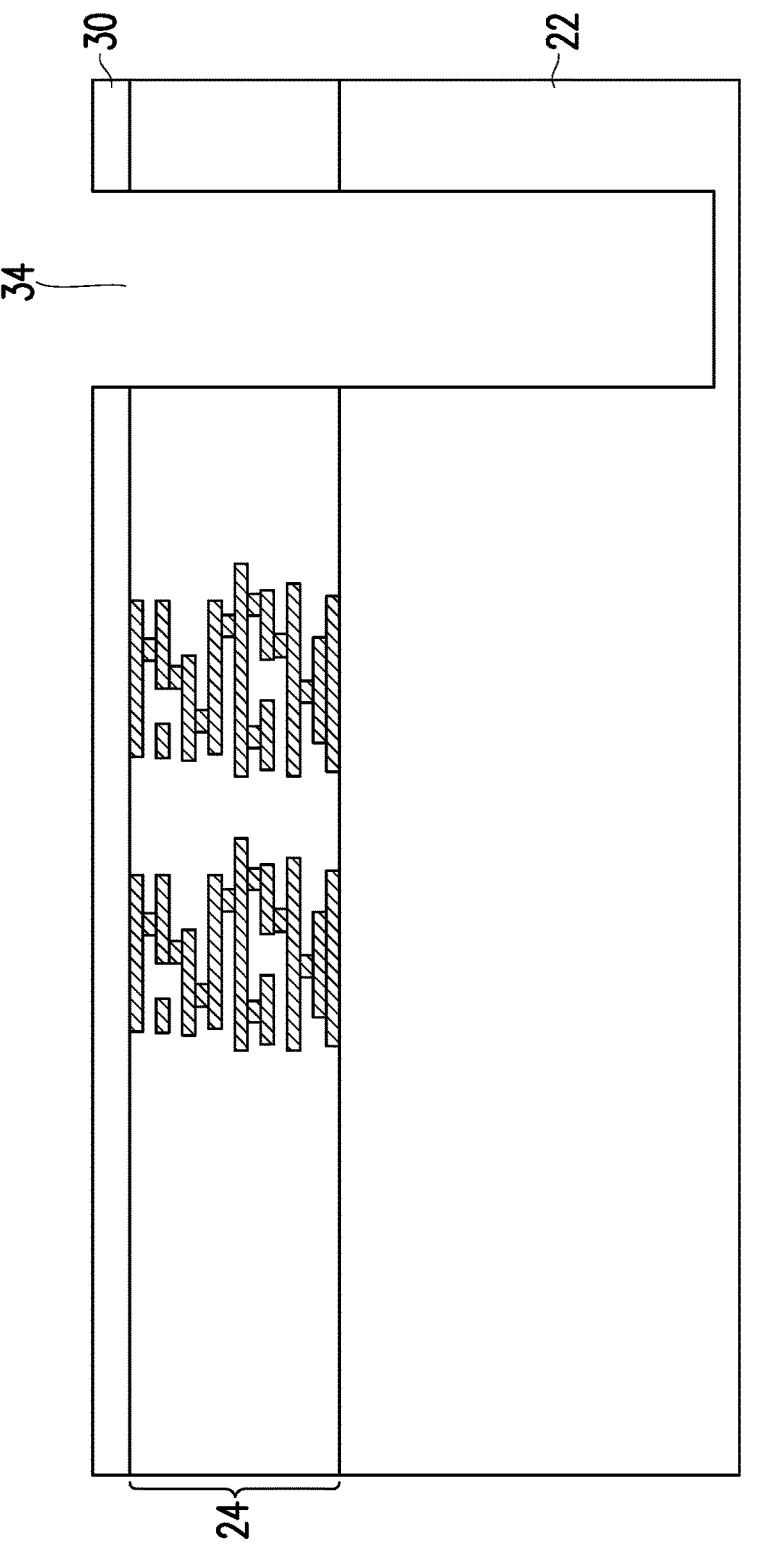

In FIG. 3, the remaining mask 30 is used as a mask during an etching process to remove exposed and underlying portions of the dielectric layer(s) of the interconnect structure 24 and the substrate 22. A single etch process may be used to etch an opening 34 in the interconnect structure 24 and the substrate 22 or a first etch process may be used to etch the interconnect structure 24 and a second etch process may be used to etch the substrate 22. In some embodiments, the opening 34 is formed with a plasma dry etch process, a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, CIF's. The utilization of a DRIE process with the passivation cycle(s) and the etch cycle(s) enables a highly anisotropic etching process. In some embodiments, the etch process(es) may any acceptable etching process, such as by wet or dry etching.

Figure 4:
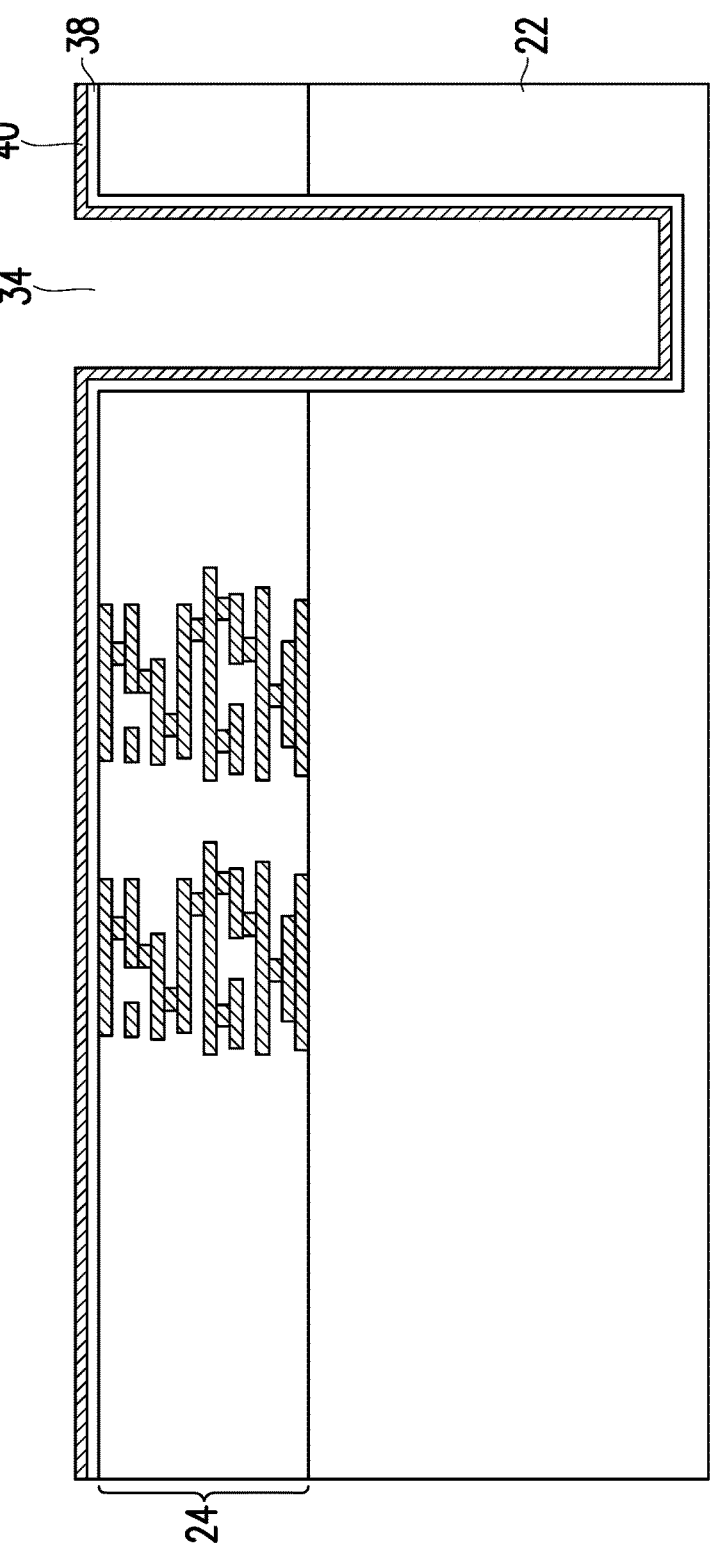

As illustrated in FIG. 4, after forming the opening 34, the photoresist 30 is removed. The photoresist 30 may be removed by an acceptable ashing or stripping process, such as using an oxygen plasma or the like.

Further in FIG. 4, a liner layer 38 is conformally deposited on the interconnect structure 24 and on the bottom surface and sidewalls of the opening 34. In some embodiments, the liner layer 38 includes one or more layers of dielectric materials and may be used to physically and electrically isolate the subsequently formed through vias from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer 38 may be formed using CVD, PECVD, ALD, the like, or a combination thereof.

In a subsequent step, as shown in FIG. 4, a seed layer 40 is formed over liner layer 38. In some embodiments, the seed layer 40 is a metal layer, which may be a single layer or a composite layer comprising a plurality of sub-layers formed of different materials. In some embodiments, the seed layer 40 comprises a titanium layer and a copper layer over the titanium layer. The seed layer may be formed using, for example, physical vapor deposition (PVD) or the like. In some embodiments, a barrier layer (not shown) may be formed on the liner layer 38 prior to forming the seed layer 40. The barrier layer may comprise Ti, TiN, the like, or a combination thereof.

Figure 5:
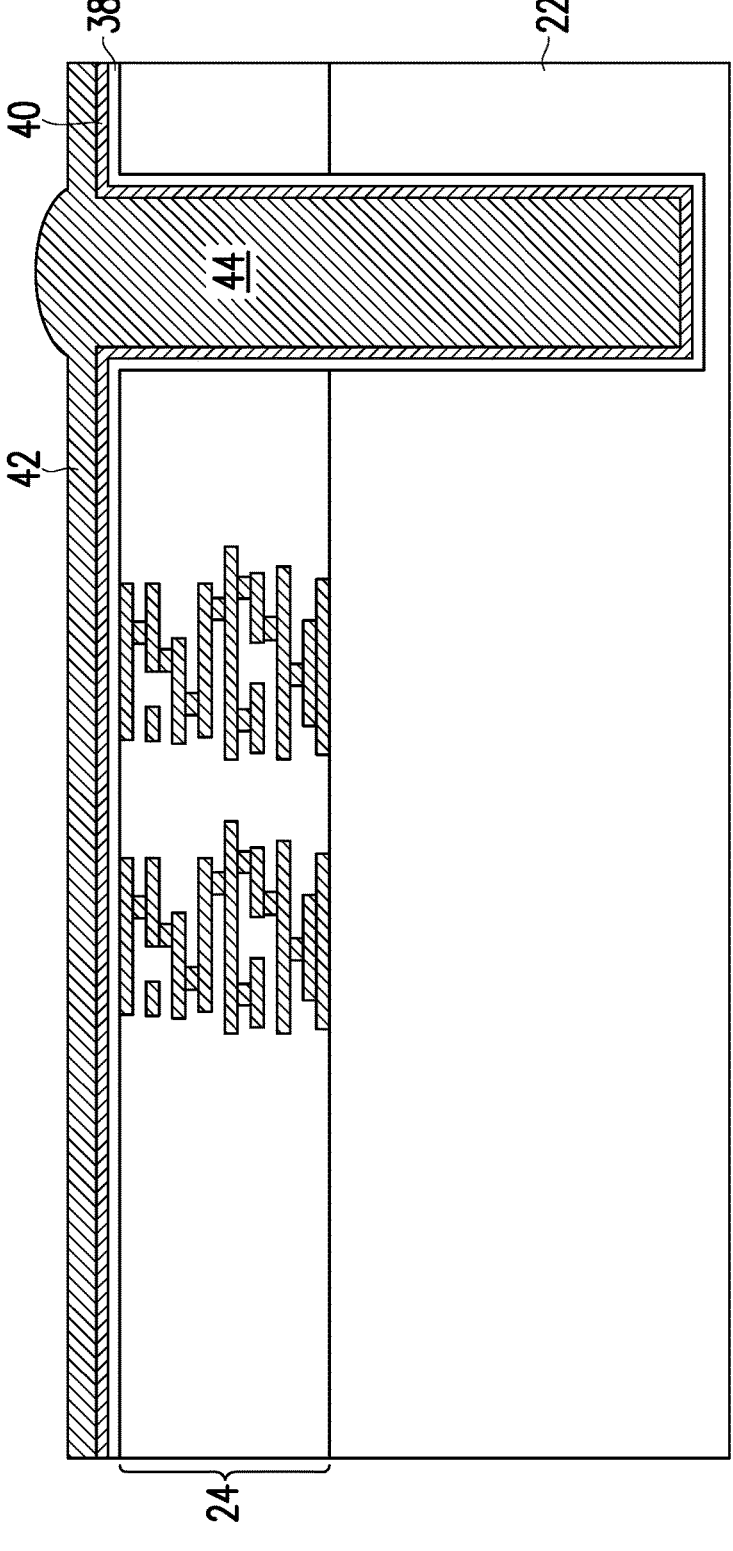

In FIG. 5, a conductive material 42 is formed on the seed layer 40 and fills the opening 34. The conductive material 42 may be formed by plating, such as electroplating including electrochemical plating, electroless plating, or the like. The conductive material may comprise a metal, like copper, titanium, tungsten, aluminum, or the like.

After the conductive material 42 is formed, an anneal process is then performed. The anneal process may be performed to prevent subsequent extrusion of the conductive material of the TSV 44 (sometime referred to as TSV pumping). The TSV pumping is caused by a coefficient of thermal expansion (CTE) mismatch between the conductive material 42 and the substrate 22 and can cause damage to structures (e.g., metallization patterns) over the TSV.

Figure 6:
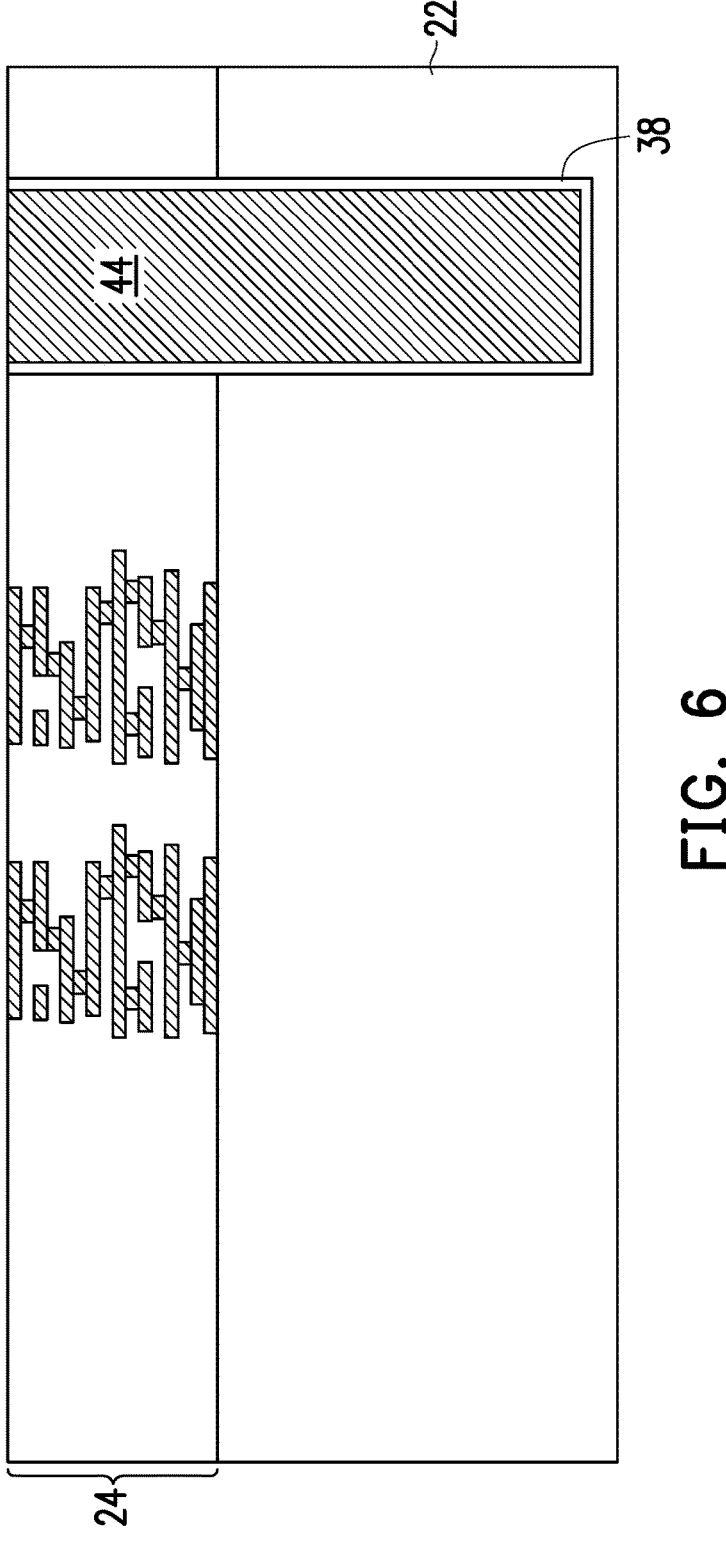
Figure 6:

Following the anneal process, a planarization process is performed to remove portions of the conductive material 42, the seed layer 40, and the liner layer 38 outside the openings 34 to form a TSV 44 as illustrated in FIG. 6. Top surfaces of the TSV 44 and the topmost dielectric layer of the interconnect structure 24 are coplanar after the planarization process within process variations. The planarization process may be, for example, a chemical-mechanical polish (CMP), a grinding process, or the like. In some embodiments, the upper portion of the TSV 44 (formed in the interconnect structure 24) has a greater width than the lower portion of the TSV 44 (formed in the substrate 22). In some embodiments, the width of the TSV 44 is constant through the interconnect 24 and the substrate 22.

Figure 7:
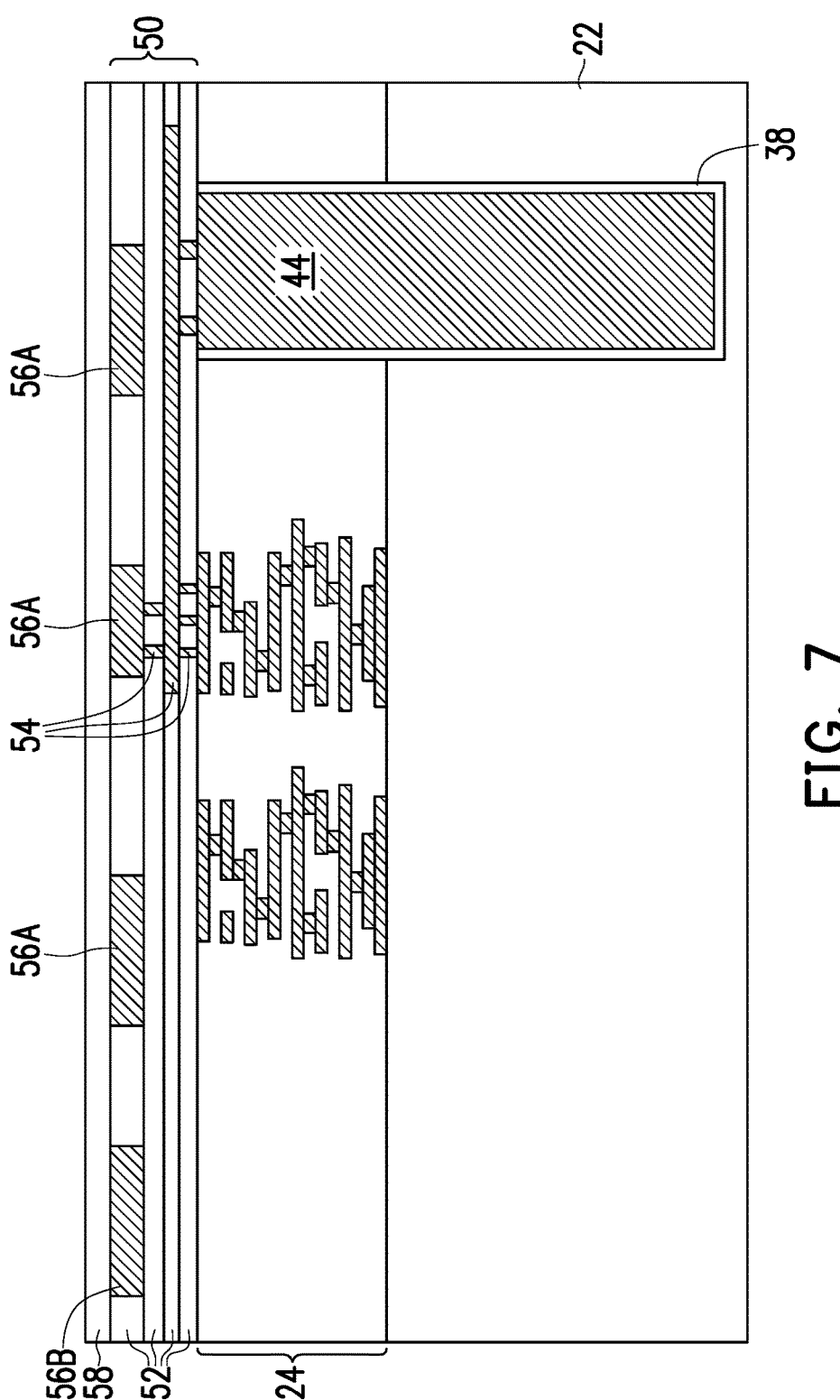
Figure 14:
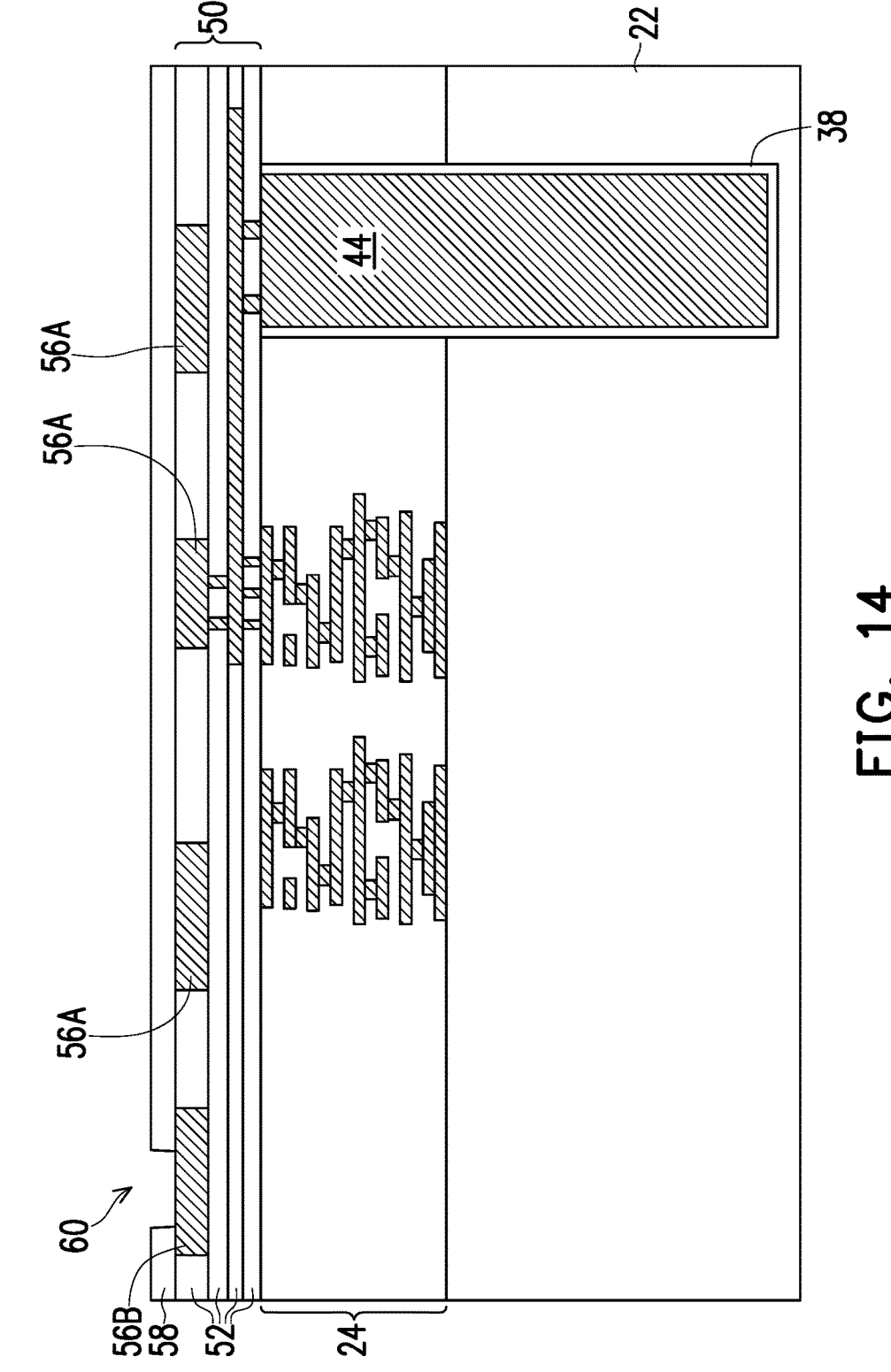

Referring to FIG. 7, an interconnect structure 50 is formed over the structure of FIG. 6. The interconnect structure 50 includes dielectric layers 52, metallization patterns and vias 54, and top metal 56 (including top metal 56A and 56B). More or fewer dielectric layers and metallization patterns and vias may be formed than is shown in FIG. 14. The interconnect structure 50 is connected to the interconnect structure 24 and TSV 44 by metallization patterns and vias formed in the dielectric layer(s) 52. The metallization patterns and vias may be formed similar processes and materials as the interconnect structure 24 and the description is not repeated herein. In some embodiments, there are more than one layer of top metal 56, such as two top metal layers.

In some embodiments, the dielectric layers 52 are a same material as the dielectric layers of the interconnect structure 24, e.g., low-k dielectric. In other embodiments, the dielectric layers 52 are formed of a silicon-containing oxide (which may or may not include oxygen). For example, the dielectric layers 52 may include an oxide such as silicon oxide, a nitride such as silicon nitride, or the like.

The top metal 56 include a top metal 56A and top metal 56B. The top metal 56B are top metal structures that are going to be used for chip probe testing and have a probe pad formed directly over and connected to the top metal 56B. The top metal 56A are typical top metal structures and will not have a probe pad directly over and connected to them. Although, only a single top metal 56B is illustrated, the disclosure is not limited to this and structures that include more top metal 56B are within the scope of the disclosure. The top metal 56A and 56B are formed at the same time and by same process(es).

The metallization patterns and vias 54 and the top metal 56 may be formed using any suitable process, such as a single damascene process, a dual damascene process, a plating process, combinations thereof, or the like. An example of forming the metallization patterns and vias 54 and the top metal 56 by a damascene process includes etching dielectric layers 52 to form openings, depositing a conductive barrier layer into the openings, plating a metallic material such as copper or a copper alloy, and performing a planarization to remove the excess portions of the metallic material. In other embodiments, the formation of the dielectric layers 52, the metallization patterns and vias 54, and the top metal 56 may include forming the dielectric layer 52, patterning the dielectric layer 52 to form openings, forming a metal seed layer (not shown), forming a patterned plating mask (such as photoresist) to cover some portions of the metal seed layer, while leaving other portions exposed, plating the metallization patterns and vias 54 and the top metal 56, removing the plating mask, and etching undesirable portions of the metal seed layer. The metallization patterns and vias 54 and top metal 56 may be made of tungsten, cobalt, nickel, copper, silver, gold, aluminum, the like, or combinations thereof. In some embodiments, the top metal 56 is thicker than the metallization patterns 54, such as three times thicker, five times thicker, or any suitable thickness ratio between the metallization layers.

FIG. 7 further illustrates the formation of a passivation layer 58 over the dielectric layers 52 and the top metal 56. In some embodiments, the passivation layer 58 is formed of a same material as the dielectric layers 52. In some embodiments, the passivation layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The passivation layer 58 may be formed, for example, by spin coating, lamination, chemical vapor deposition (CVD), or the like. The passivation layer 58 may have an upper surface that is level within process variations.

Although FIG. 7 illustrates the TSV 44 directly connected to the interconnect 50, in some embodiments, the TSV may be directly connected to the interconnect 24.

Figure 8:
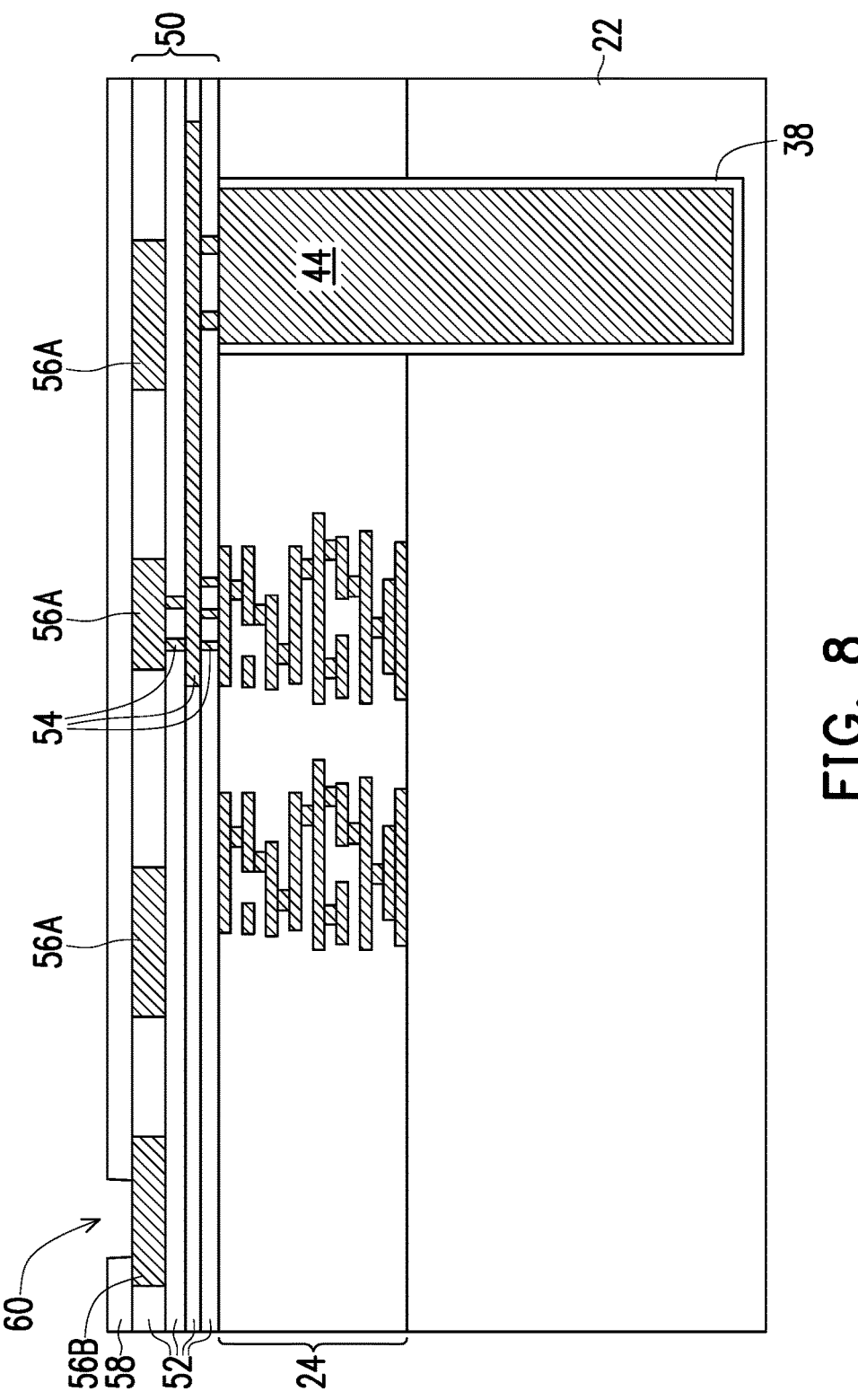

FIGS. 8 through 13 illustrate a formation and removal process of a sacrificial probe pad 68. In FIG. 8, an opening 60 is formed through the passivation layer 58 to expose portions of the top metal 56B. The opening 60 may be formed by any suitable patterning step, such as an etching step including a mask such as a photoresist (not shown).

Figure 9:
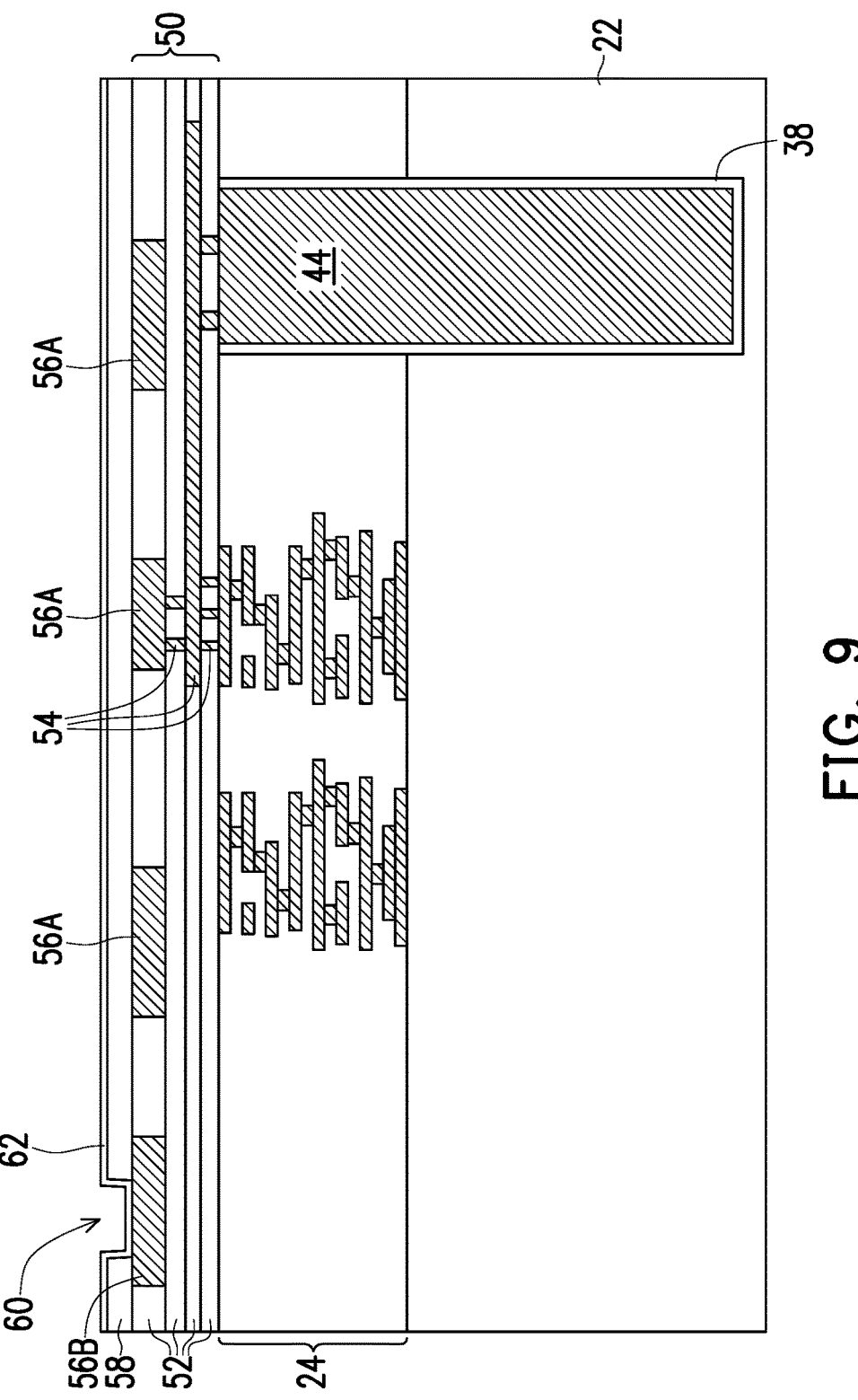

In FIG. 9, a seed layer 62 is formed over the passivation layer 58, in the openings 60, and on exposed portions of the top metal 56 in the openings 60. The materials and formation processes of the seed layer 62 may be similar to the seed layer 40 described above and the description is not repeated herein.

Figure 10:
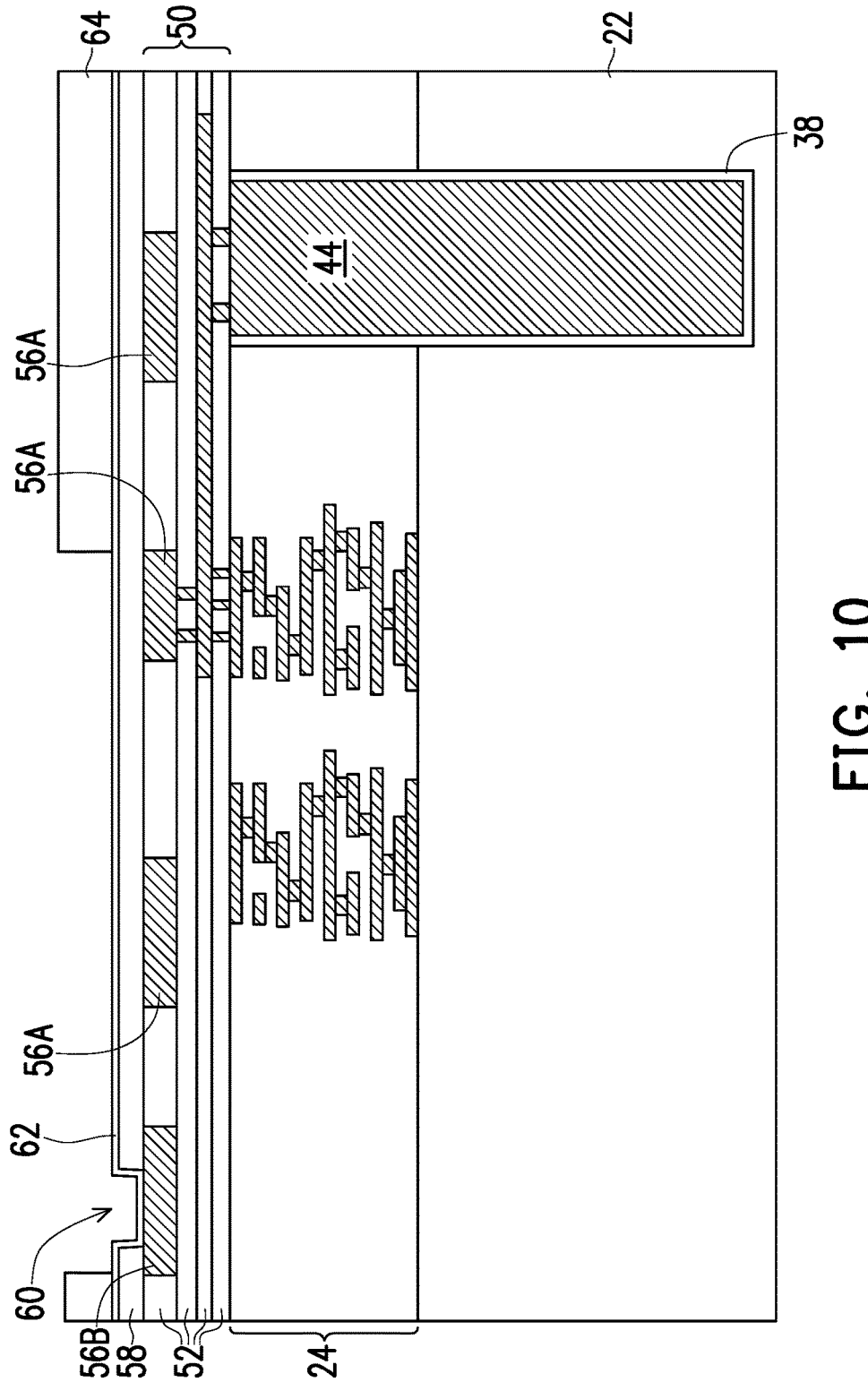

In FIG. 10, a photoresist 64 is formed and patterned over the seed layer 62. These steps are similar to the steps illustrated and described above, and the descriptions are not repeated herein.

Figure 11:
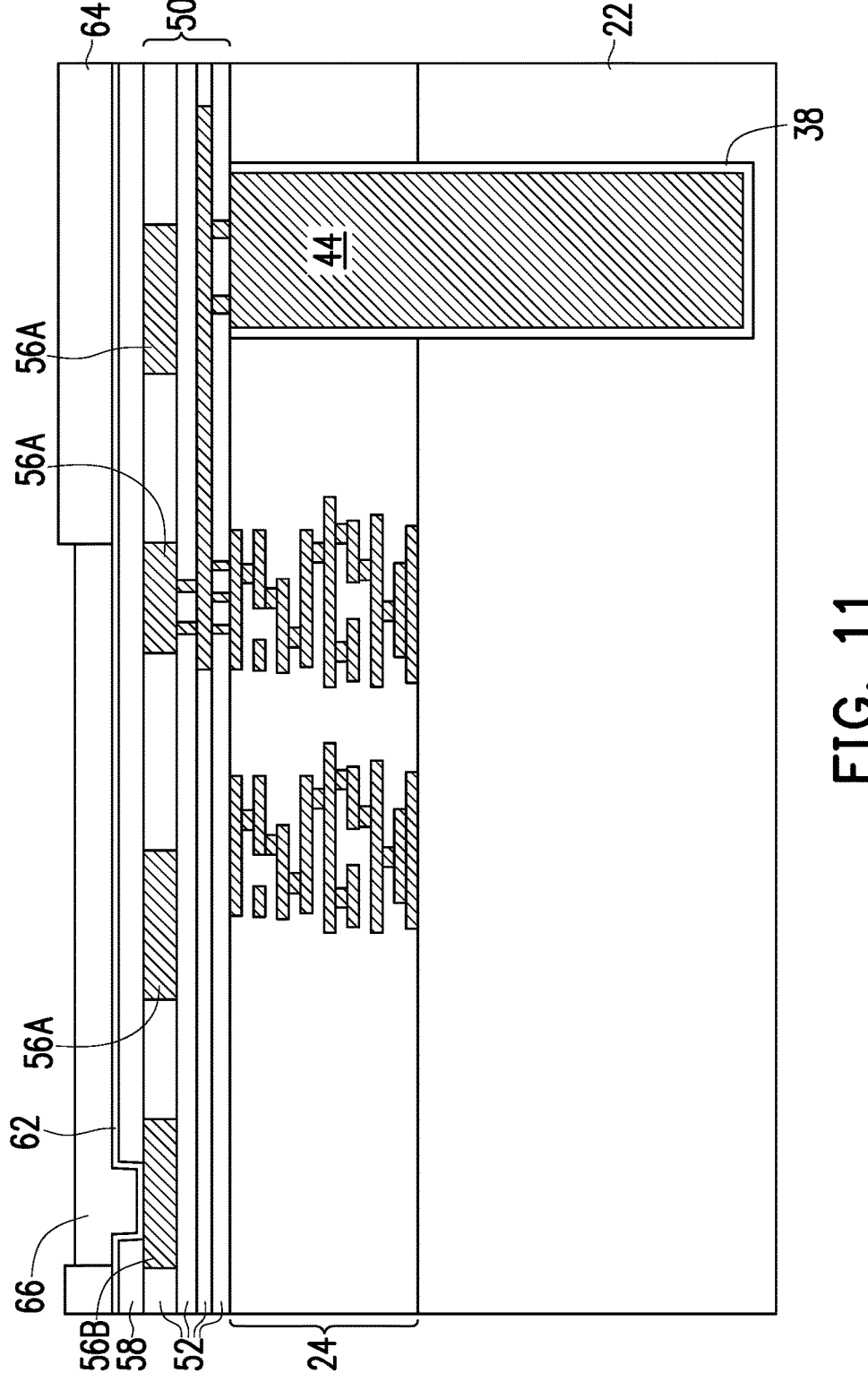

In FIG. 11, a conductive material 66 is formed on the exposed seed layer 62 in the opening of the photoresist 64. In some embodiments, the conductive material 66 is a solder (tin) material, such as nickel, aluminum, the like, or a combination thereof. The conductive material 66 may be formed by a plating process, such as electrochemical plating, electroless plating, or the like.

Figure 12:
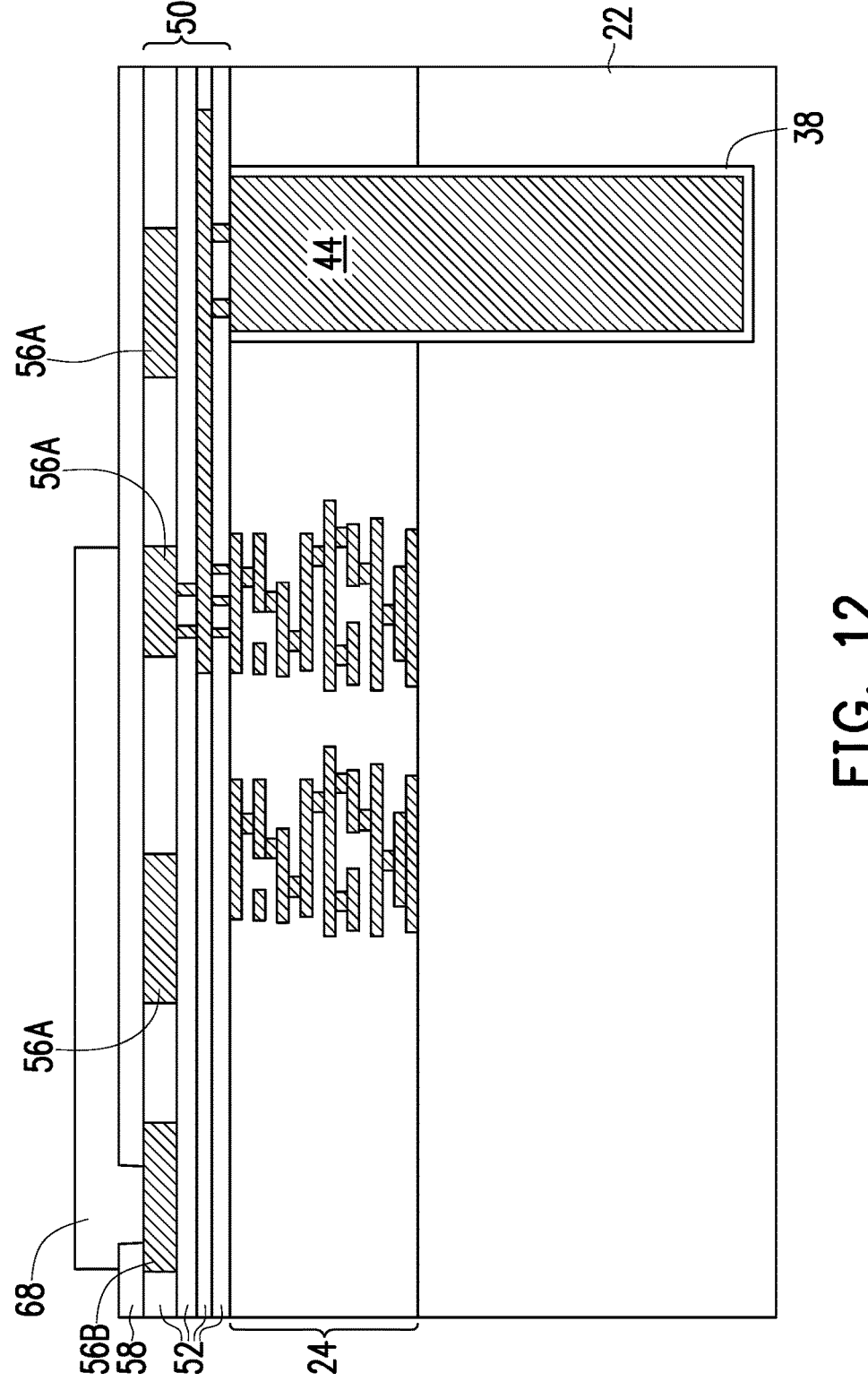
Figure 13:
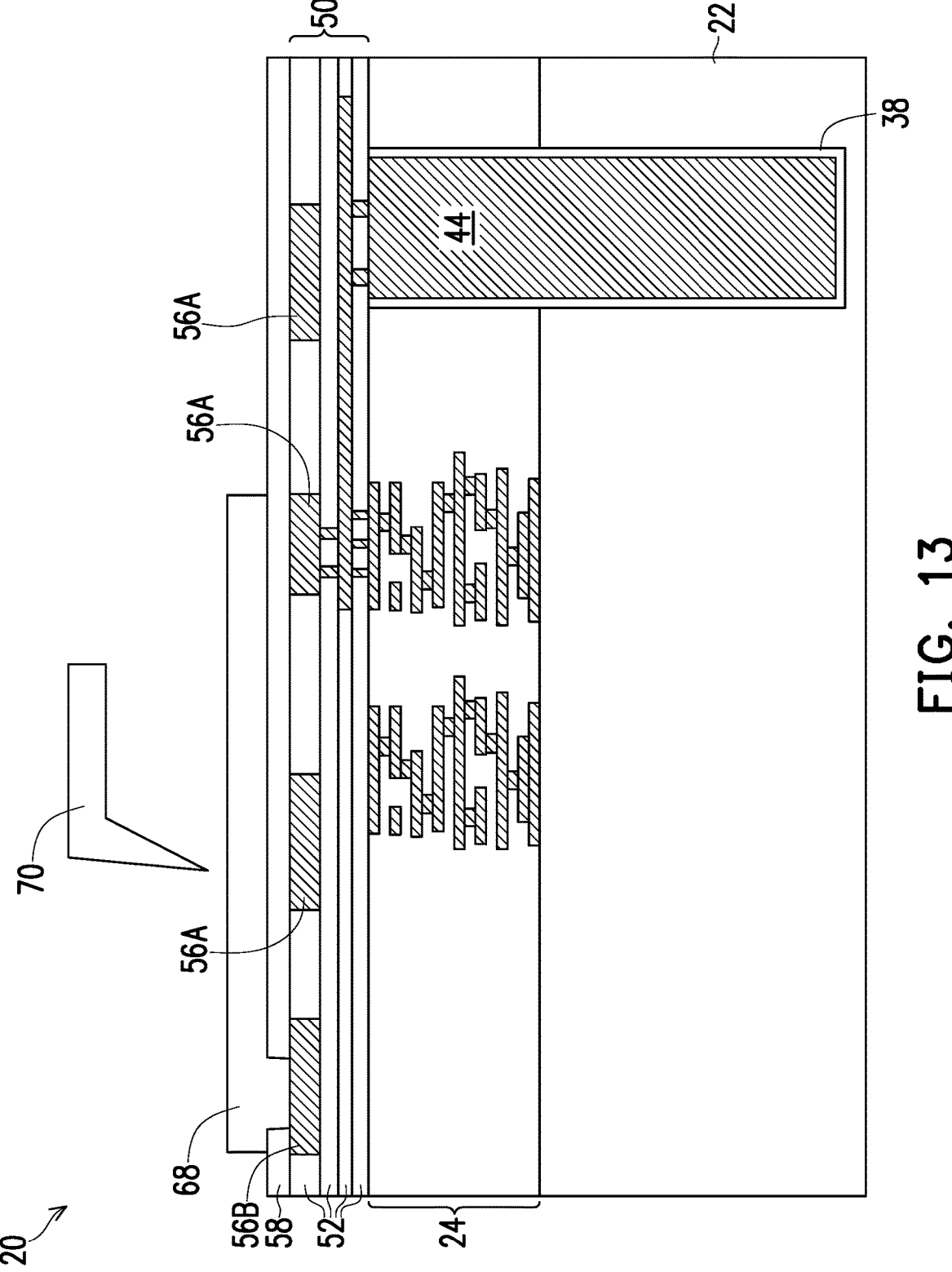

In FIG. 12, the photoresist 64 and underlying portion of the seed layer 62 are removed to form a probe pad 68. In some embodiments, the probe pad 68 has a planar top surface within process variations. The photoresist 64 may be removed by an acceptable ashing or stripping process, such as using an oxygen plasma or the like. The portions of the seed layer 62 may be removed by an acceptable etching process. FIGS. 12 and 13 do not separately illustrate the remaining portion of the seed layer 62 underlying the conductive material 66.

In FIG. 13, acceptance testing, such as circuit probe testing, is performed on the integrated circuit die 20 to ascertain whether the integrated circuit die 20 is a known good die (KGD). In some embodiments, the acceptance testing is performed on the integrated circuit die 20 before singulation while it is in wafer form. In some embodiments, the acceptance testing is performed on integrated circuit die 20 after singulation when it is in die form. The integrated circuit die 20 may be tested using one or more probes 70. The probes 70 are physically and electrically coupled to sacrificial pads 68. Although not specifically illustrated, more than one probe 70 (e.g., two probes 70) may be coupled to corresponding sacrificial pads 68 (e.g., two sacrificial pads 68). Only integrated circuit dies 20 which are KGDs undergo subsequent processing and packaging, and integrated circuit die 20 which fail the circuit probe testing are not subsequently processed and packaged. The testing may include providing power and ground voltages to sacrificial pads 68 in order to test the functionality of the integrated circuit die 20 (e.g., the integrated circuit devices and interconnect structure 24 and 50 within). In some embodiments, the circuit probe testing may include testing for known open or short circuits that may be expected based on the design of the integrated circuits within the integrated circuit die 20.

FIG. 14 illustrates the removal of the sacrificial probe pad 68 from the integrated circuit die 20. In some embodiments, the sacrificial probe pad 68 is removed by one or more etch process. In some embodiments, the conductive material 66 is removed with a first etching process and the seed layer 62 is removed by a second etching process. In some embodiments, the etch processes may be any acceptable solder etching process, such as by wet or dry etching. The removal of the sacrificial probe pad 68 re-exposes the top metal 56B through the opening 60.

Figure 15:
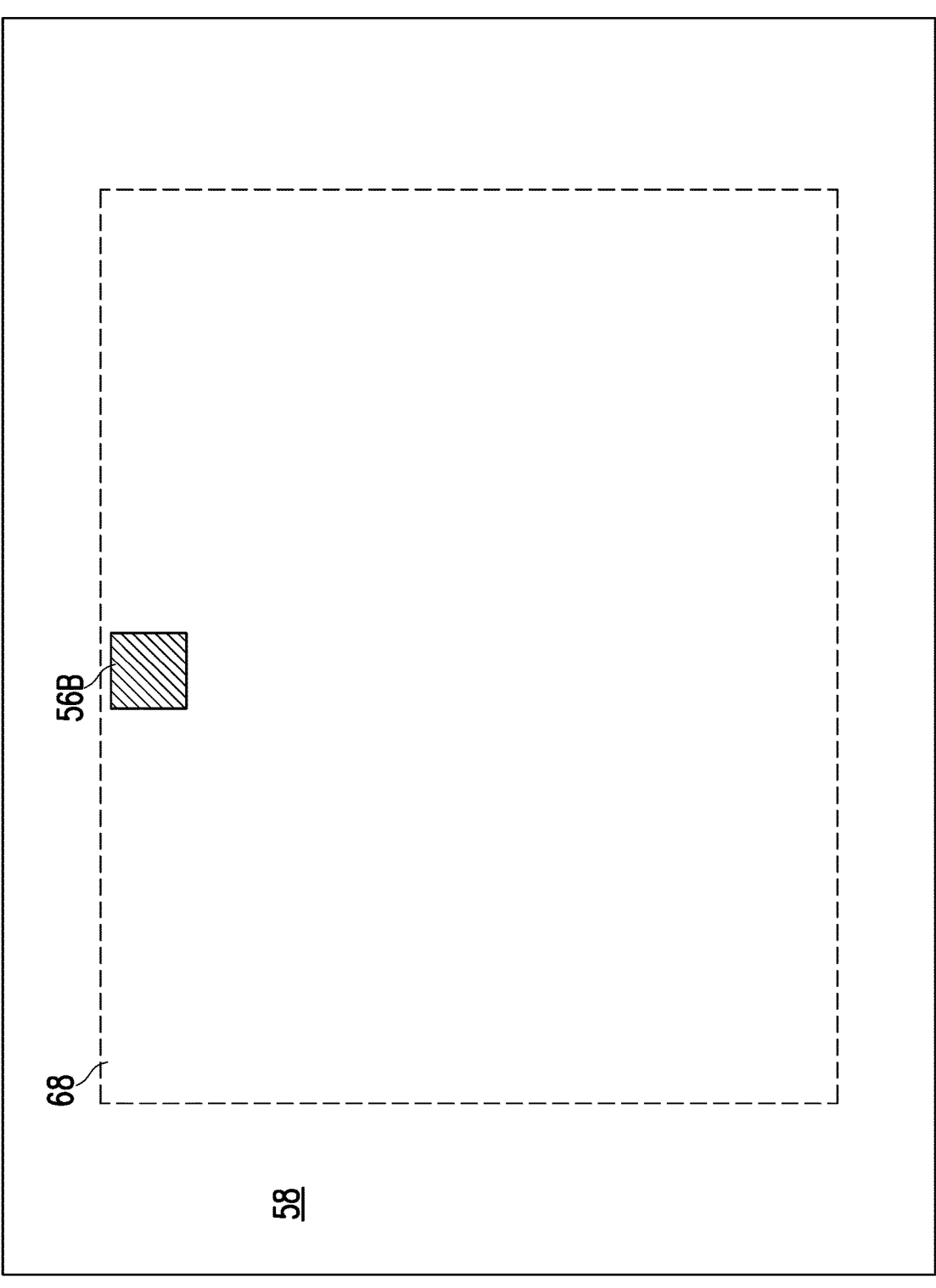

FIG. 15 illustrates a plan view overlaying the top metal 56B and the sacrificial probe pad 68. In some embodiments, the area in the plan view of the top metal 56B is more than 2000 times smaller than the area in the plan view of the sacrificial probe pad 68. In some embodiments, the sacrificial probe pad 68 has a size of 50 μm by 50 μm and the top metal 56B has a size of 1 μm by 1 μm. Thus, in those embodiments, the area in the plan view of the top metal 56B is 2500 times smaller than the area in the plan view of the sacrificial probe pad 68. By having a removable probe pad, embodiments of the present disclosure allow for interconnect routing, formation of bond vias and bond pads, and the like in the area that was previously occupied by the probe pad 68 (see, e.g., FIGS. 13 and 19) and can have up to 10% more area for interconnect routing than related structures.

Figure 16:
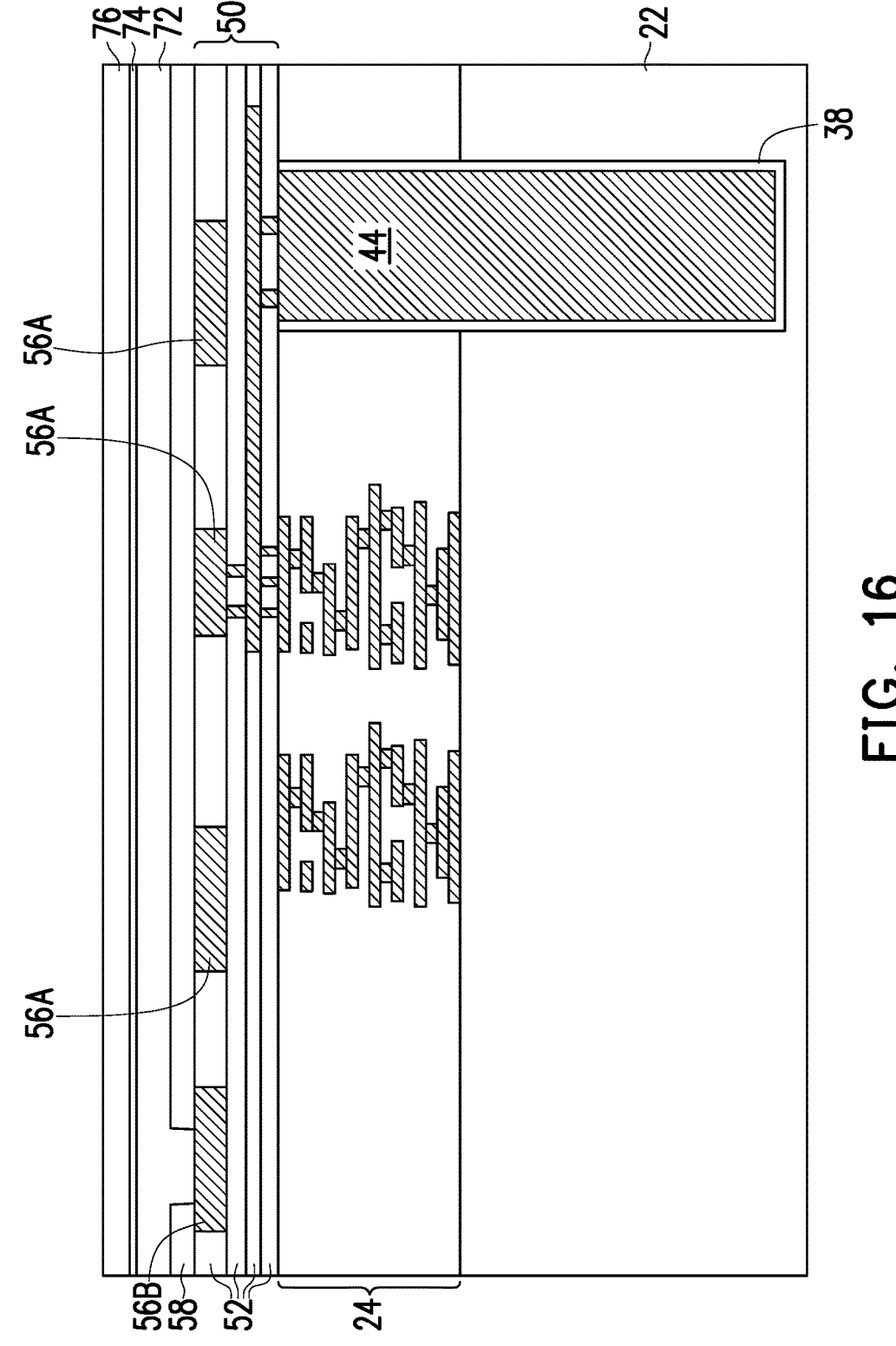

In FIG. 16, dielectric layers 72, 74, and 76 are formed over the passivation layer 58 with dielectric layer 72 being formed in the opening 60 in the passivation layer 58. Although FIG. 16 illustrates three dielectric layers 72, 74, and 76, more or fewer than three dielectric layers may be formed. The dielectric layer 74 fills the opening 60 in the passivation layer 58 and physically contacts the top metal 56B. The dielectric layer is separated from the top metal structures 56A by the passivation layer 58. The dielectric layer 72 provides a planar top surface to form the dielectric layers 74 and 76 on and may be considered a planarization dielectric layer 72. The dielectric layer 74 may provide etch stop functions during subsequent formation of bond pads and bond vias and may be considered an etch stop layer 74. The dielectric layer 76 may provide dielectric bonding functions and may be considered a bonding dielectric layer 76.

In some embodiments, the dielectric layers 72, 74, and 76 are formed of a silicon-containing oxide. For example, the dielectric layers 72, 74, and 76 may include an oxide such as silicon oxide, a nitride such as silicon nitride, an oxynitride such as silicon oxynitride, the like, or a combination thereof.

Figure 17:
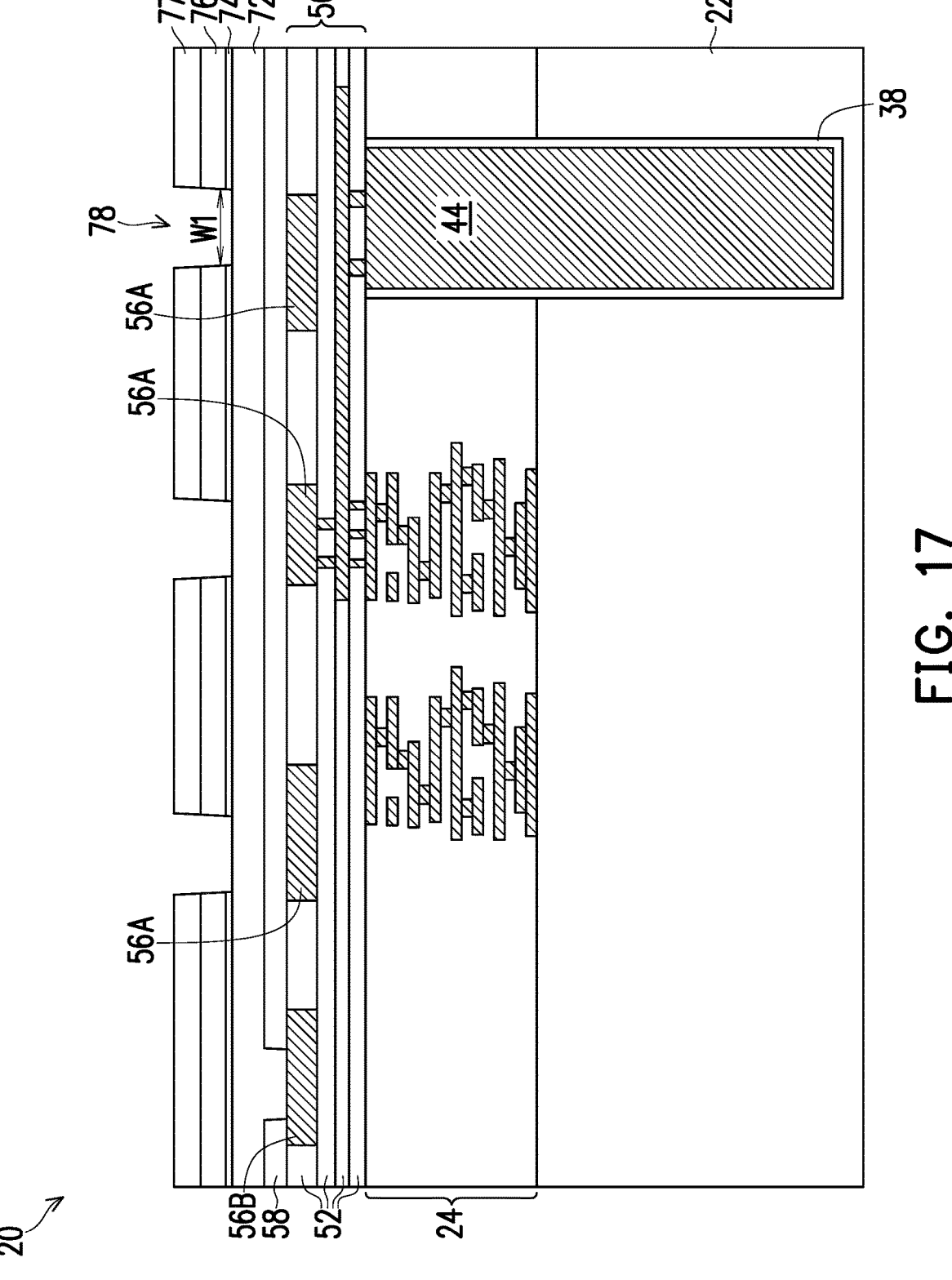
Figure 18:
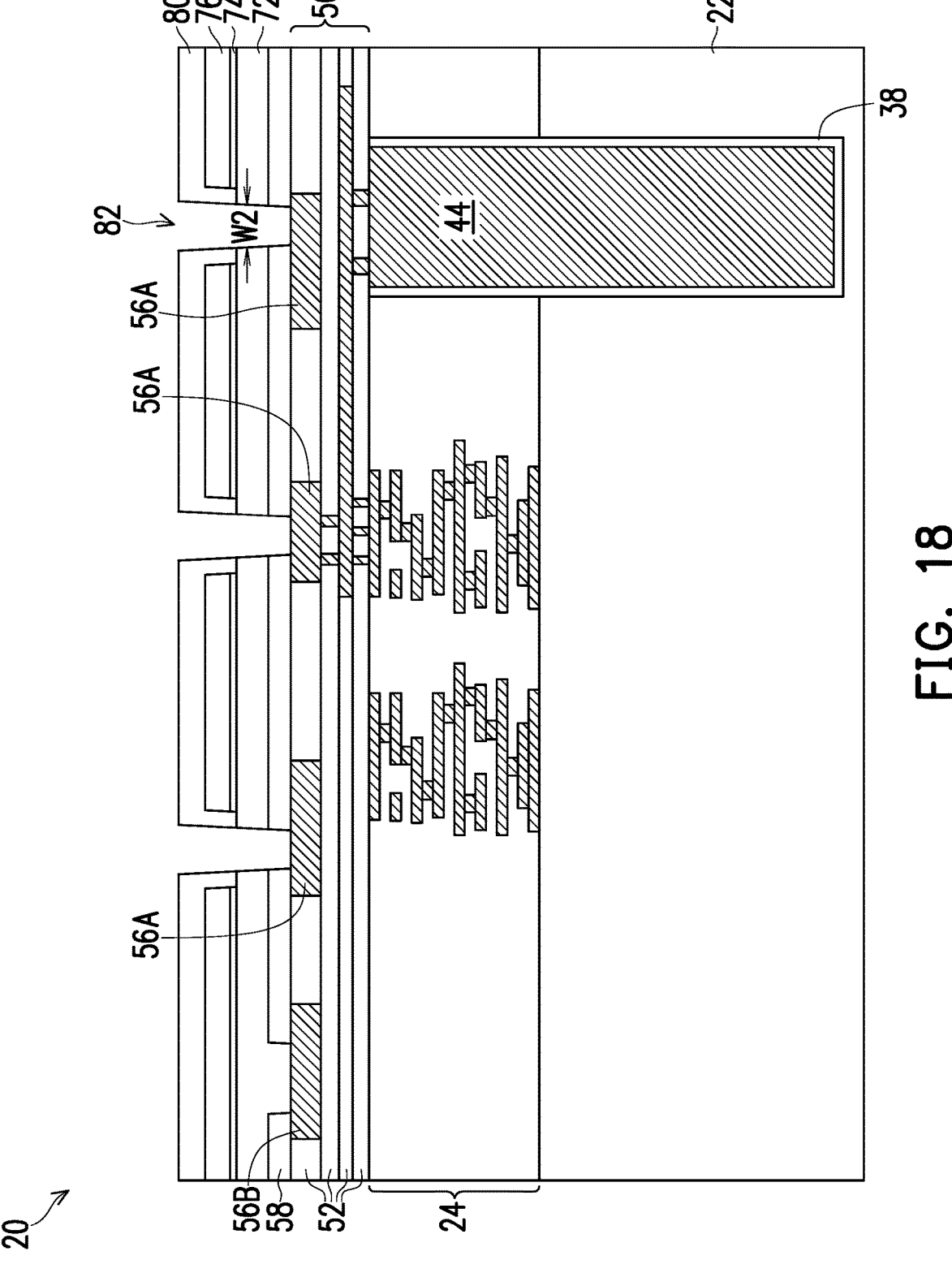
Figure 19:
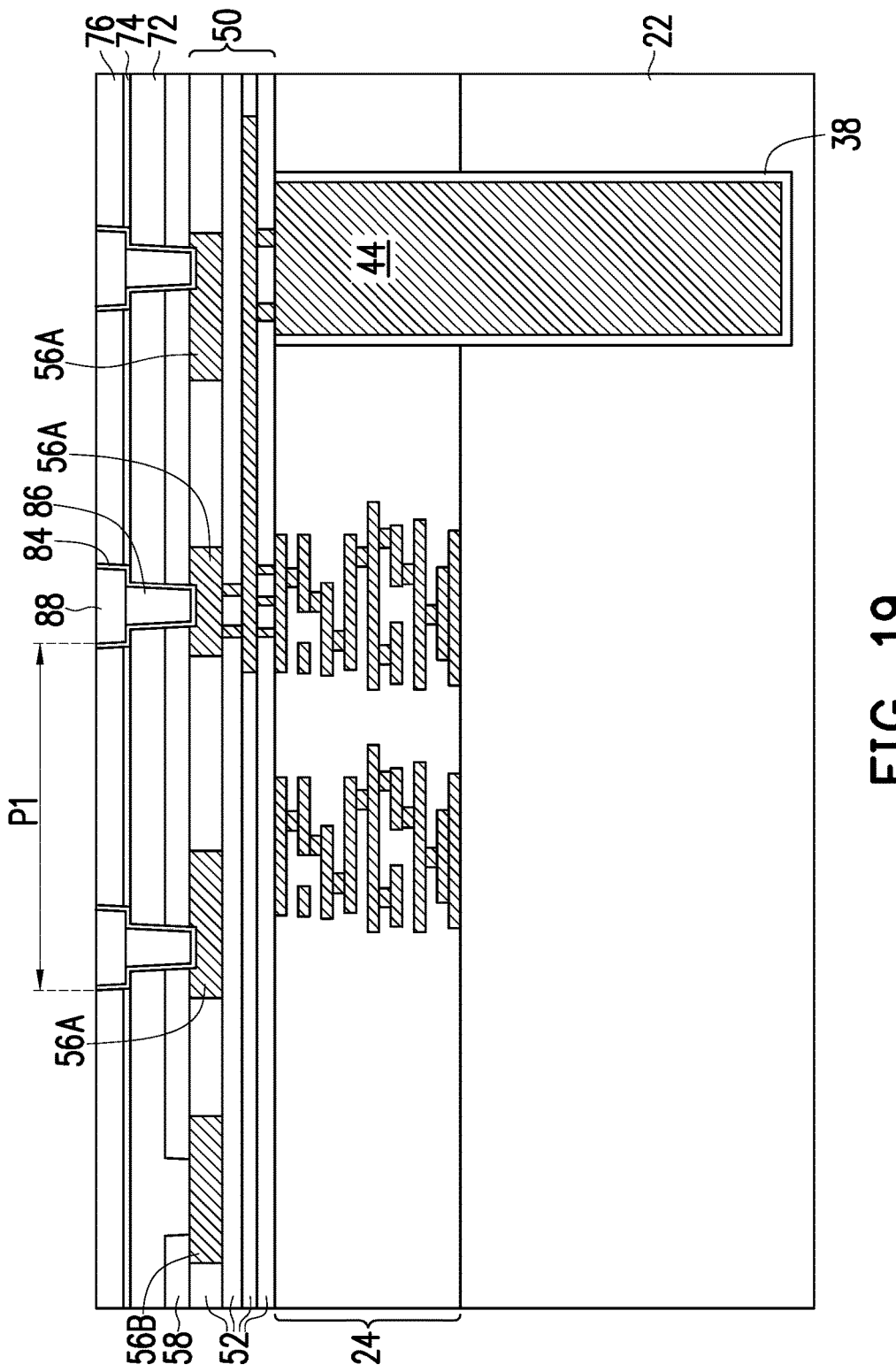

FIGS. 17 through 19 illustrate the formation of bond pad vias 86 and bond pads 88 are formed in the dielectric layers 72, 74, and 76 and connected to the top metal 56A. The bond pad vias 86 and bond pads 88 may be formed using be achieved using any suitable process, such as a single damascene process, a dual damascene process, combinations thereof, or the like. FIGS. 17 through 19 illustrate a dual damascene process.

In FIG. 17, a photoresist 77 is formed and patterned on the dielectric layer 76. The photoresist 77 may be formed by spin coating or the like and may be exposed to light for patterning. The pattern of the photoresist 77 corresponds to openings 78 for the bond pads 88 (see FIG. 19). Further in FIG. 17, the dielectric layer 76 is patterned to form the openings 78 using the patterned photoresist 77 as a mask with the patterning process stopping on the dielectric layer 74. The exposed portions of the dielectric layer 76 may be removed, such as by using an acceptable etching process, such as by wet and/or dry etching. The openings 78 have a width W1. In some embodiments, the width W1 is as small as 1.4 μm. In some embodiments, the width W1 is in a range from 1.4 μm to 2.5 μm.

FIG. 18 illustrates the removal of the photoresist 77, the formation and patterning of photoresist 80, and the patterning of dielectric layers 74 and 72. The photoresist 77 may be removed by an acceptable ashing or stripping process, such as using an oxygen plasma or the like. Further in FIG. 18, the photoresist 80 is formed and patterned on the patterned dielectric layer 76 and in the openings 78. The photoresist 80 may be formed by spin coating or the like and may be exposed to light for patterning. The pattern of the photoresist 80 corresponds to openings 82 for the bond pad vias 86 (see FIG. 19). Further in FIG. 18, the dielectric layers 74 and 72 are patterned to form the openings 82 using the patterned photoresist 80 as a mask with the patterning process exposing portions of the top metal 56A. The exposed portions of the dielectric layers 74 and 72 may be removed, such as by using an acceptable etching process, such as by wet and/or dry etching. The openings 82 have a width W2. In some embodiments, the width W2 is as small as 0.6 μm. In some embodiments, the width W2 is in a range from 0.6 μm to 1.8 μm.

FIG. 19 illustrates the removal of the photoresist 80 and the formation of a barrier layer 84, the bond pad vias 86, and the bond pads 88 in the openings 78 and 82. The barrier layer 84 may be formed in the openings prior to forming bond pad vias 86 and the bond pads 88. In some embodiments, the barrier layer 84 may comprise Ti, TiN, the like, or a combination thereof. The bond pad vias 86 and the bond pads 88 may be formed by similar processes and materials as the top metal 56 and vias 54 and the description is not repeated herein. The bond pads 88 may be formed of or comprise copper, for example. Adjacent bond pads 88 have a pitch P1. In some embodiments, the pitch P1 is as small as 3.0 μm. In some embodiments, the pitch P1 is in a range from 3.0 μm to 9.0 μm. By having a removable probe pad, embodiments of the present disclosure allow for bond vias and bond pads to be formed in the area that was previously occupied by the probe pad (see, e.g., FIGS. 13 and 19) and can have up to 10% more area for interconnect routing than related structures.

The top surfaces of the bond pads 88 are coplanar (within process variation) with the top surface of the uppermost dielectric layer 76. The planarization is achieved through a chemical mechanical polishing (CMP) process or a mechanical grinding process.

Figure 20:
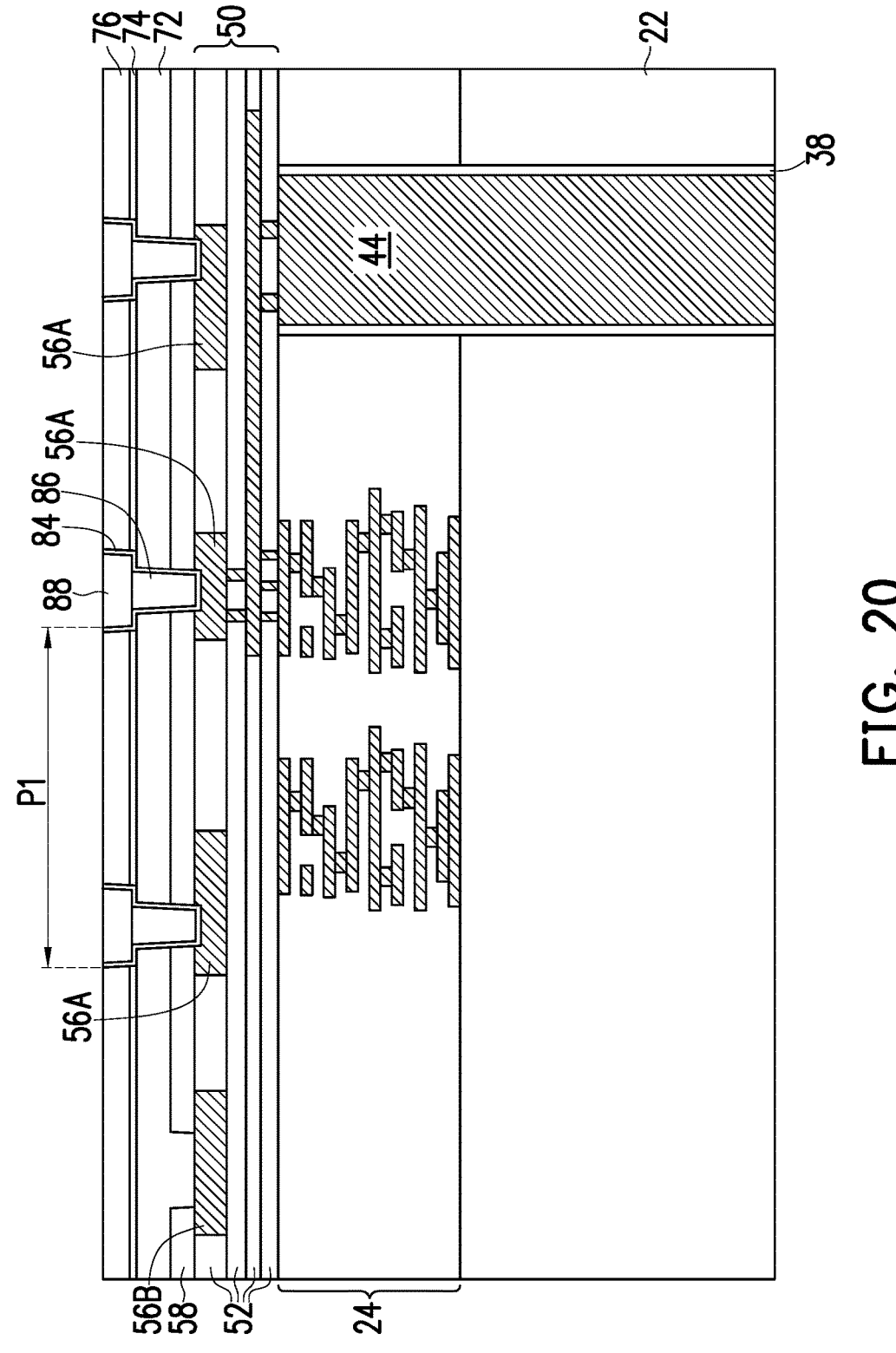

As shown in FIG. 20, the integrated circuit die 20 is thinned by thinning the substrate 22 before the subsequent singulation process. The thinning may be performed through a planarization process such as a mechanical grinding process or a CMP process. The thinning process exposes the TSV 44 and the liner 38. After thinning, the through via 44 provides electrical connection from a back side of the substrate 22 to a front side of the substrate 22 (e.g., the interconnects 24 and 50 and bond pads 88).

The integrated circuit die 20 of the disclosed method results in one or more top metal 56B structures not having a bond pad 88 and bond pad via 86 overlying and connected to the top metal 56B. These top metal 56B may be referred to as testing top metal 56B structures. These top metal 56B have the dielectric layer 72 over and physically contacting the top metal 56B

Figure 21:
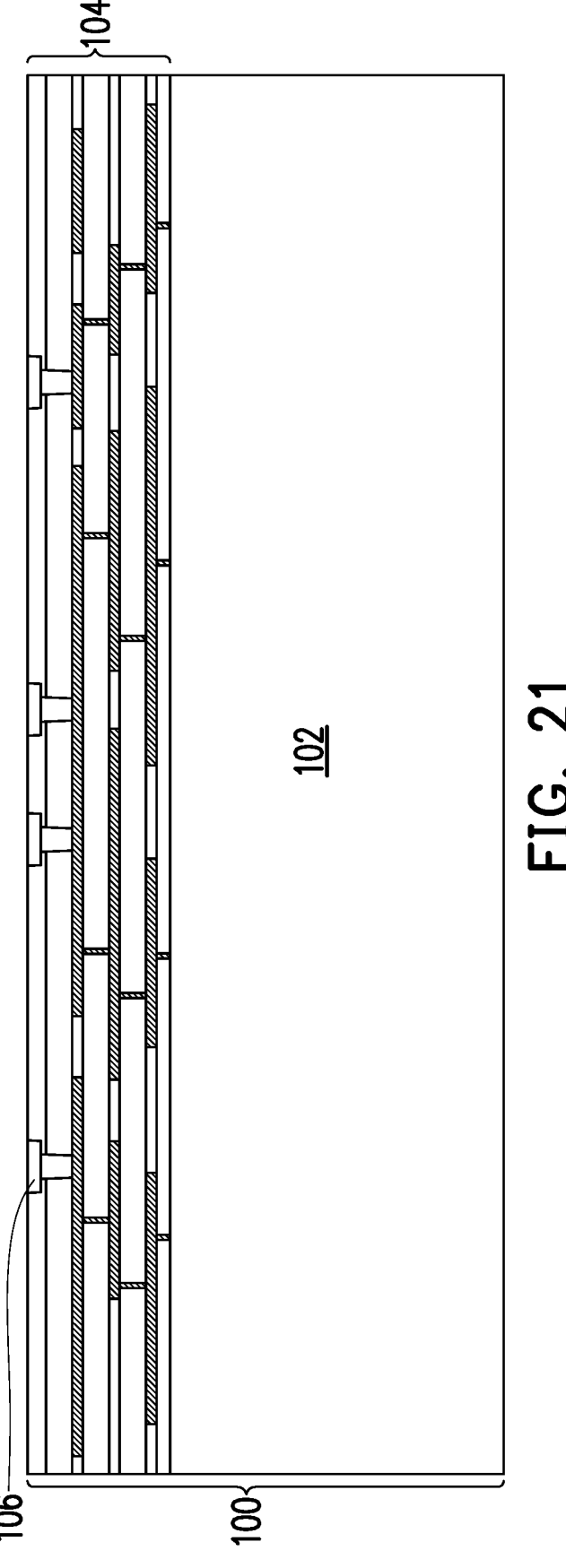

FIG. 21 illustrates a package structure 100. The package structure 100 includes a substrate 102, similar to the substrate 22 of the integrated circuit die 20, and an interconnect structure 104 including bond pads 106. The interconnect structure 104 and the bond pads 106 may be similar to the interconnect structures 24 and 50 and bond pads 88, respectively, described above and the descriptions are not repeated herein.

Figure 22:
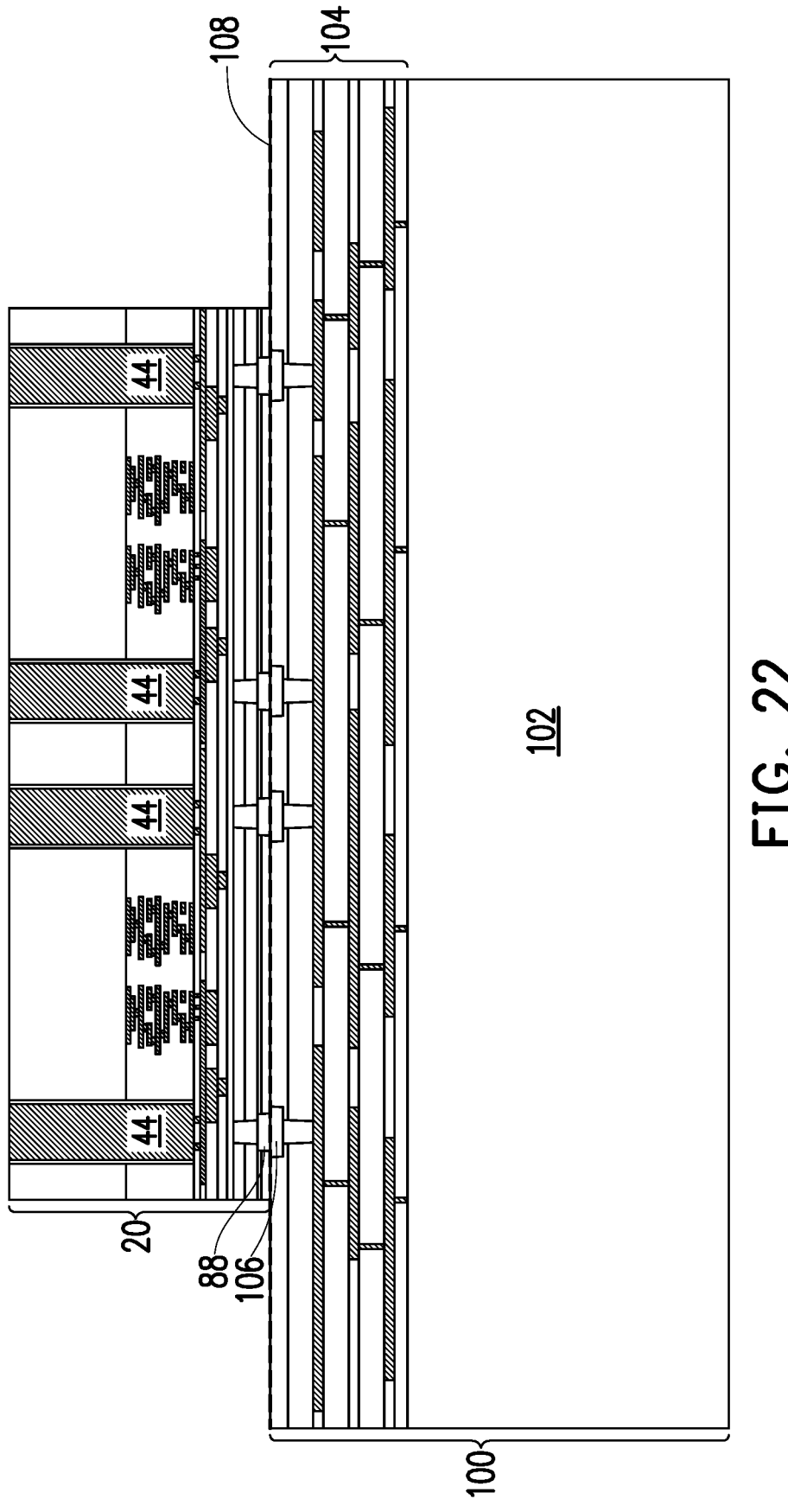

In FIG. 22, the integrated circuit die 20 is bonded to the package structure 100. The bonding of the integrated circuit die 20 to the package structure 100 may be achieved through direct bonding, in which both metal-to-metal direct bonding (between the bond pads 88 and 106) and dielectric-to-dielectric bonding (such as Si—O—Si bonding between surface dielectric layers of the integrated circuit die 20 and the package structure 100) are formed. Furthermore, there may be a single integrated circuit die 20 or a plurality of dies 20 bonded to the same package structure 100. The plurality of dies 20 bonded to the same package structure 100 may be identical to, or different from, each other to form a homogenous or a heterogeneous structure.

The die 20 is disposed face down such that the front sides of the die 20 face the package structure 100 and the back sides of the dies 20 face away from the package structure 100. The die 20 is bonded to the package structure 100 at an interface 108. As illustrated by FIG. 22, the direct bonding process directly bonds the topmost dielectric layer of the interconnect 104 of the package structure 100 to the topmost dielectric layer 76 of the die 20 at the interface 108 through fusion bonding. In an embodiment, the bond between the topmost dielectric layer of the interconnect 104 and the topmost dielectric layer 76 of the die 20 may be an oxide-to-oxide bond. The direct bonding process further directly bonds the bond pads 88 of the die 20 to the bond pads 106 of the package structure 100 at the interface 108 through direct metal-to-metal bonding. Thus, electrical connection between the die 20 and the package structure 100 is provided by the physical connection of the bond pads 88 to the bond pads 106.

As an example, the direct bonding process starts with aligning the die 20 with the package structure 100, for example, by aligning the bond pads 88 to the bond pads 106. When the die 20 and the package structure 100 are aligned, the bond pads 88 may overlap with the corresponding bond pads 106. Next, the direct bonding includes a pre-bonding step, during which the die 20 is put in contact with the package structure 100. The direct bonding process continues with performing an anneal, for example, at a temperature between 150° C. and 400° C. for a duration between 0.5 hours and 3 hours, so that the copper in the bond pads 88 and the bond pads 106 inter-diffuses to each other, and hence the direct metal-to-metal bonding is formed.

Figure 23:
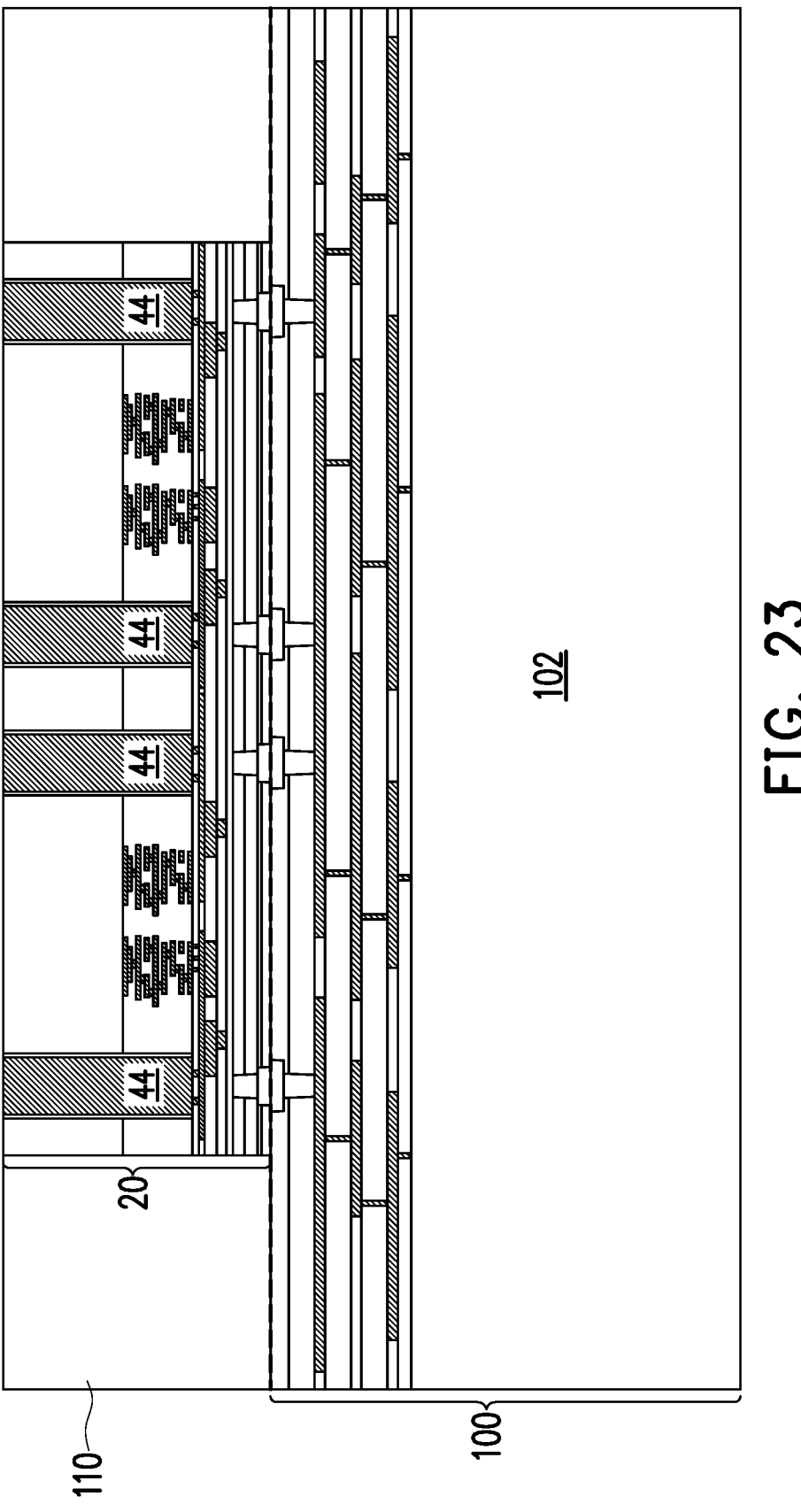

Next, as shown in FIG. 23, a gap-filling process is performed to encapsulate the integrated circuit die 20 in an encapsulant 110. After formation, the encapsulant 110 encapsulates the integrated circuit die 20. The encapsulant 110 may comprise an oxide. Alternatively, the encapsulant may be a molding compound, a molding underfill, a resin, an epoxy, or the like. The encapsulant 110 may be applied by compression molding, transfer molding, or the like, and may be applied in liquid or semi-liquid form and then subsequently cured. After the encapsulant 110 is deposited, a planarization process is performed to level a back-side surface of the integrated circuit die 20 with the top surface of the encapsulant 110 and to expose the TSVs 44. Surfaces of the TSVs 44, the substrate 22, and the encapsulant 110 are coplanar after the planarization process within process variations. The planarization process may be, for example, a CMP a grinding process, or the like. In some embodiments, the planarization may be omitted, for example, if the TSVs 44 are already exposed.

Figure 24:
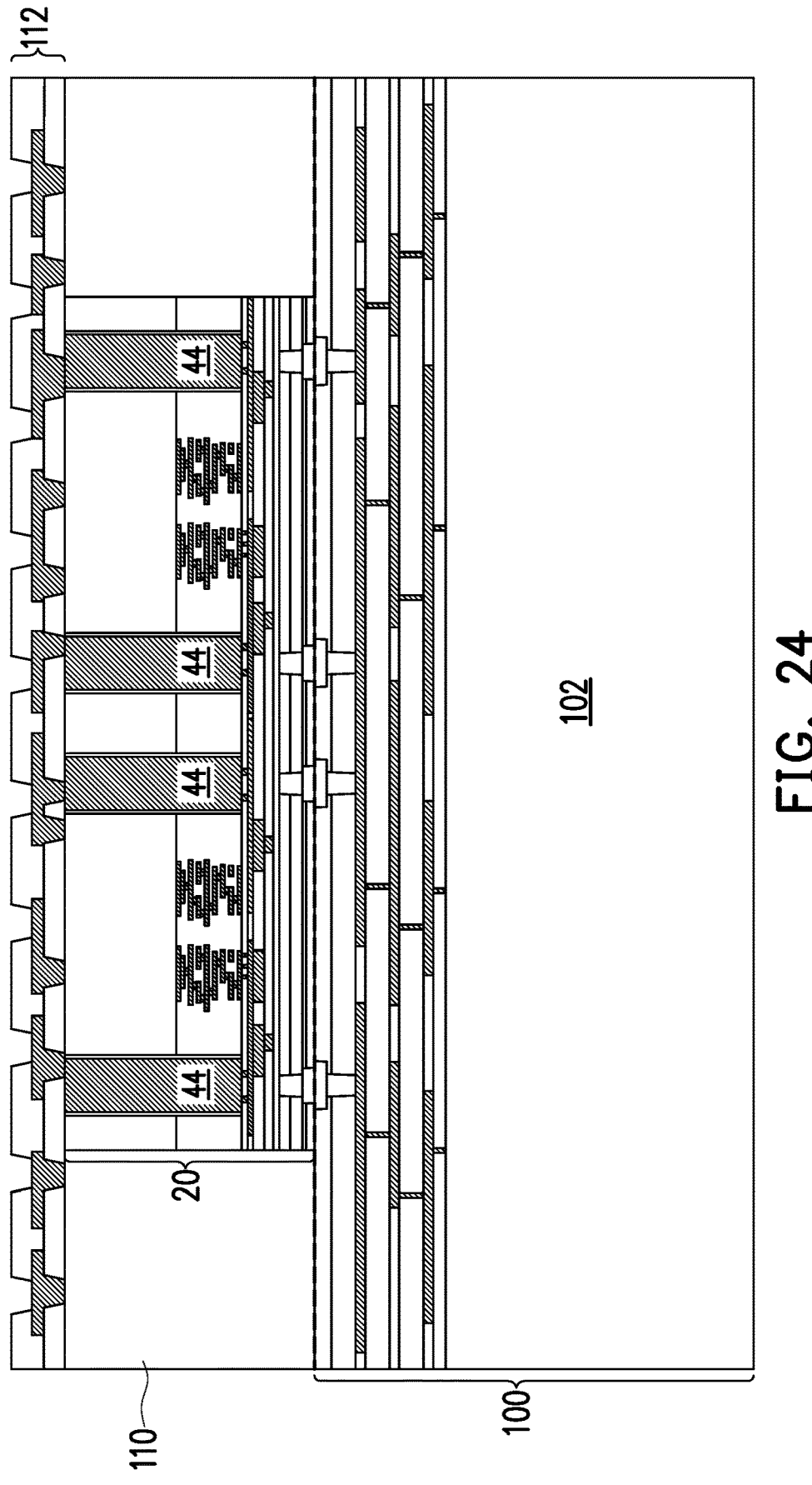

In FIG. 24, a redistribution structure 112 is deposited on the encapsulant 110, the TSVs 44, and the integrated circuit die 20. The redistribution structure 112 may include redistribution lines (RDLs), such as metal traces (or metal lines), and vias underlying and connected to the metal traces. The redistribution lines of the redistribution structure 112 are physically and electrically connected to the TSVs 44 of the die 20.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the redistribution structure 112. The patterning process may be an acceptable process, such as by exposing the dielectric or passivation layer to light when the dielectric layer is a photo-sensitive material or by etching using, for example, an anisotropic etch.

Figure 25:
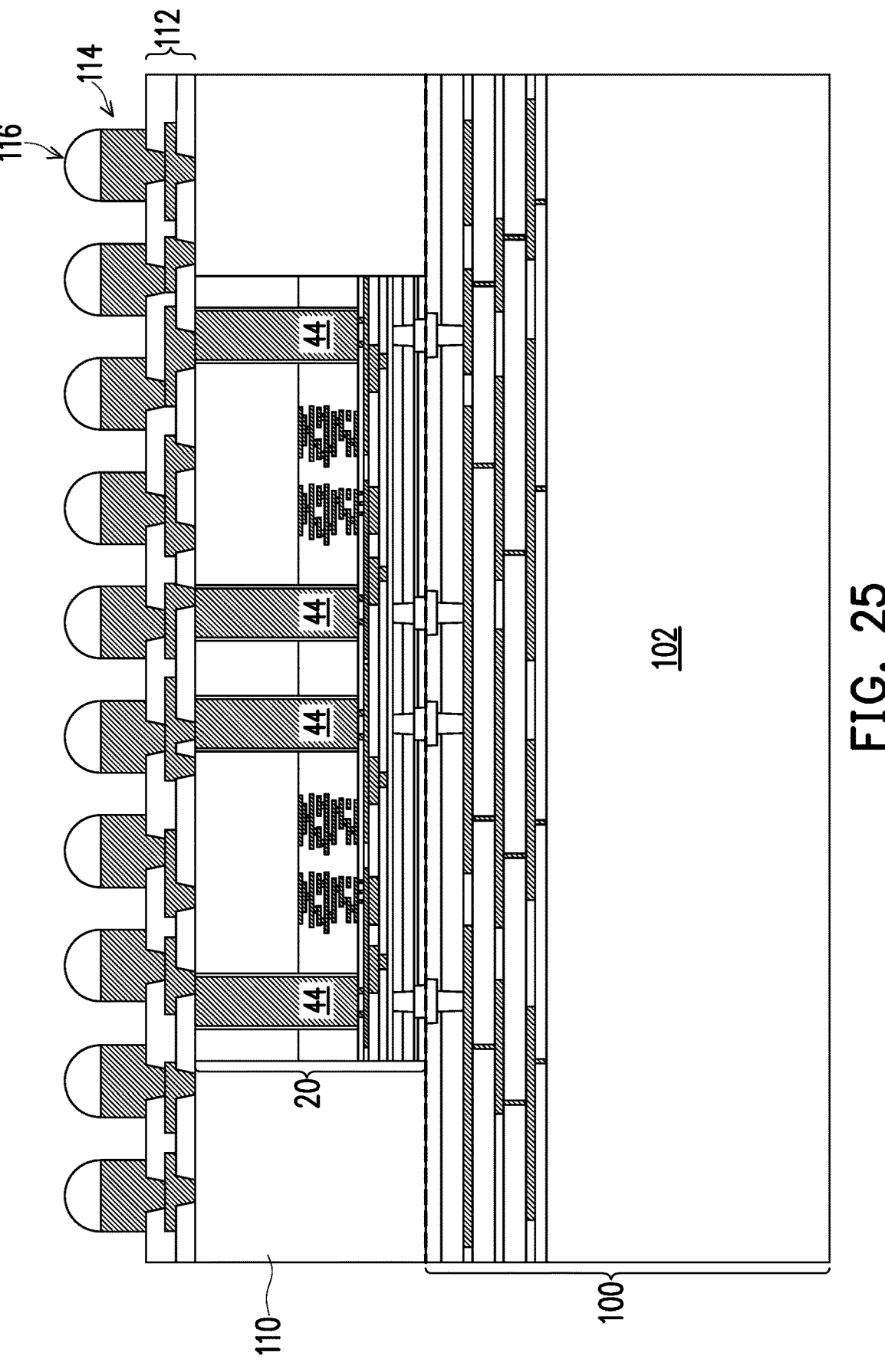

As shown in FIG. 25, bumps 114 are formed through the openings in the dielectric layers of the redistribution structure 112 to contact metallization patterns in the redistribution structure 112. The bumps 114 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 114 are C4 bumps. The bumps 114 may be formed by sputtering, printing, electro plating, electroless plating, CVD, or the like. The bumps 114 may be solder free and have vertical sidewalls within process variations. In some embodiments, a metal cap layer (not shown) is formed on the top of the bumps 114. The metal cap layer may include nickel, tin, tin-lead, gold, silver, palladium, indium, nickel-palladium-gold, nickel-gold, the like, or a combination thereof and may be formed by a plating process.

Further shown in FIG. 25, conductive connectors 116 are formed on the bumps 114. The conductive connectors 116 may be formed from a conductive material such as solder, copper, aluminum, gold, nickel, silver, palladium, tin, the like, or a combination thereof. In some embodiments, the conductive connectors 116 are formed by initially forming a layer of solder through methods such as evaporation, electroplating, printing, solder transfer, ball placement, or the like. Once a layer of solder has been formed on the structure, a reflow may be performed in order to shape the conductive connectors 116 into desired bump shapes.

Figure 26:
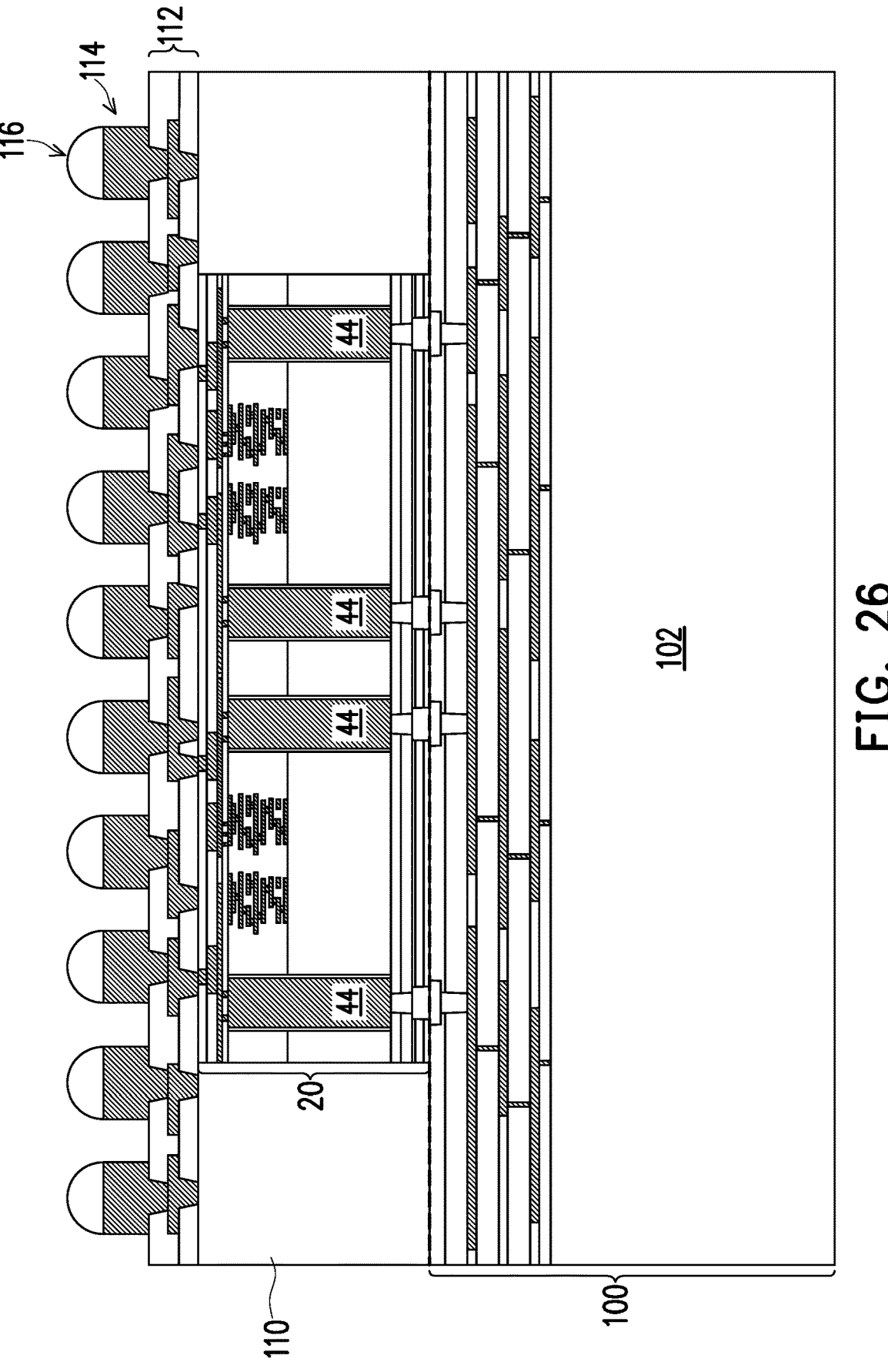
FIG. 26 illustrates a cross-sectional view of an intermediate stage in the formation of a package according to an embodiment.

The embodiment depicted in FIG. 25 is a chip-on-wafer structure bonded in a face-to-face configuration. Alternatively, the integrated circuit die 20 and the package structure 100 may be bonded in a face-to-back configuration, as shown in FIG. 26. For example, in FIG. 26, the back of the die 20 (e.g., exposed ends of the TSVs 44 and substrate 22) is bonded to the face of the package structure 100. Details regarding this embodiment that are similar to those for the previously described embodiment are not repeated herein.

Figure 27:
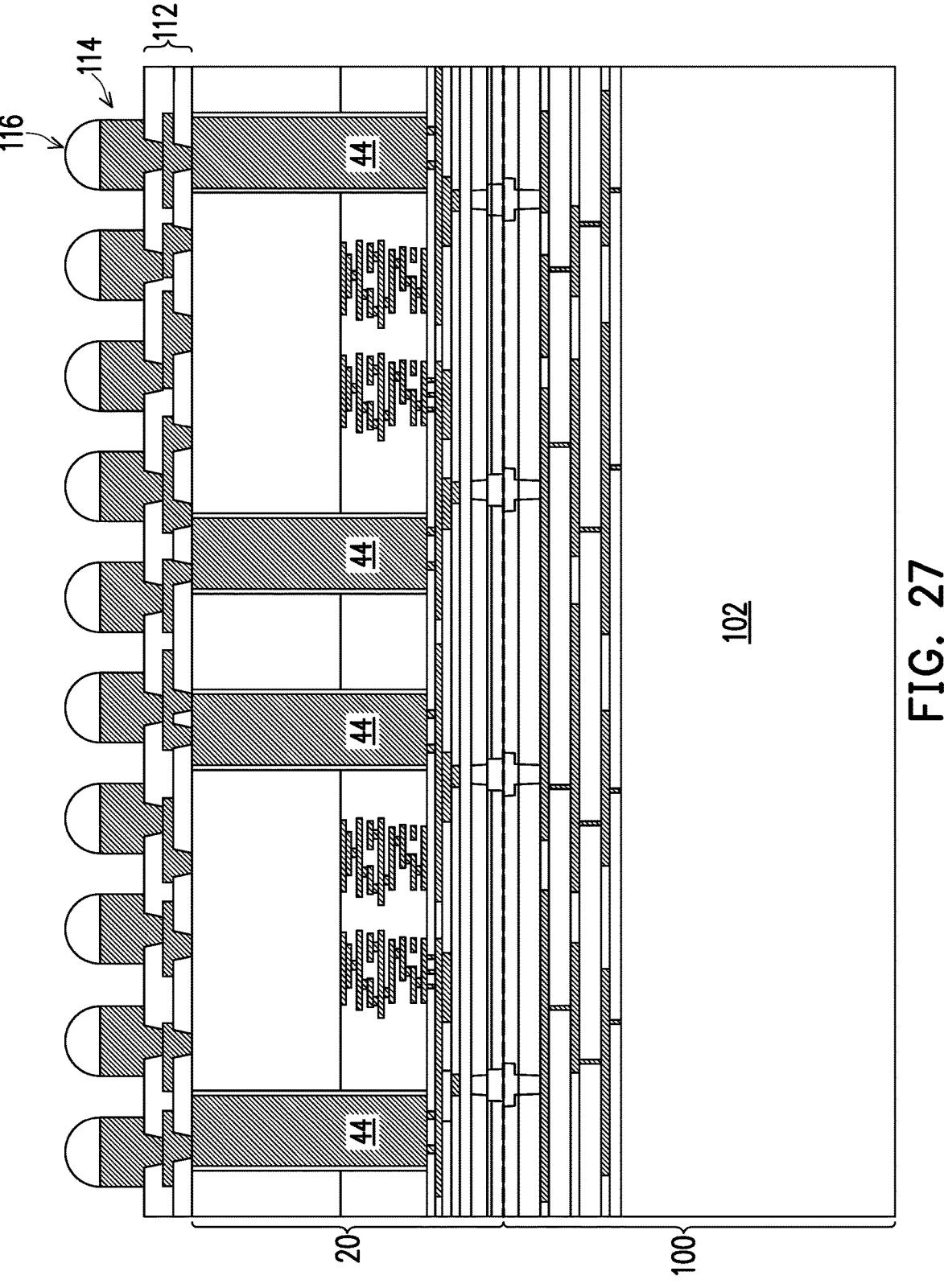
FIG. 27 illustrates a cross-sectional view of an intermediate stage in the formation of a package according to an embodiment.

FIG. 27 illustrates a cross-sectional view of a wafer-on-wafer structure in accordance with some embodiments. This embodiment is similar to the embodiment illustrated in FIGS. 1 through 25 except that this embodiment is a wafer-on-wafer structure instead of a chip-on-wafer structure. Details regarding this embodiment that are similar to those for the previously described embodiment will not be repeated herein.

In FIG. 27, the structure is a wafer-on-wafer structure bonded in a face-to-face configuration in which the upper structure is a wafer 20. The wafer 20 is formed similar to the die 20 described above and the description is not repeated herein. With this embodiment, the steps of singulating the die 20 and the formation of the encapsulant 110 in the previous embodiment are no longer needed and those steps can be omitted from this embodiment. In this embodiment, the wafer 20 and the package structure 100 are both wafers and are a same size.

In other embodiments, the wafer 20 may be bonded to the package structure 100 in a face-to-back configuration. For example, the back of the wafer 20 (e.g., exposed ends of the TSVs 44 and substrate 22) could be bonded to the face of the package structure 100.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Embodiments discussed herein may be discussed in a specific context, namely an interconnect structure with a sacrificial probe pad that can be integrated into a device (e.g., a chip or die) or a package (e.g., system on integrated chip (SoIC), a chip-on-wafer (CoW) package structure, or a wafer-on-wafer (WoW) package structure). The interconnect structure includes sacrificial probe pad to allow intermediate testing of the chip or device for known good die integration while increasing the area for interconnect routing. In some embodiments, the sacrificial probe pad is formed of a material that can be removed after the testing is performed so that underlying metallization layers can be reached by conductive vias. In related structures, the probe pad is not removable and the underlying area it is not reachable by conductive vias such that the underlying area is not used for interconnect routing but is unutilized space of the interconnect. By having a removable probe pad, the routing area of the interconnect can be increase by up to 10% for a single chip or die while ensuring yield with known good dies/chips.

An embodiment includes a method including forming a first interconnect structure over a first substrate, the first interconnect structure including dielectric layers and metallization patterns therein, the metallization patterns including a top metal layer including top metal structures. The method also includes forming a passivation layer over the top metal structures of the first interconnect structure. The method also includes forming a first opening through the passivation layer, a first top metal structure of the top metal structures being exposed through the first opening. The method also includes forming a probe pad in the first opening and over the passivation layer, the probe pad being electrically connected to the first top metal structure. The method also includes performing a circuit probe test on the probe pad. The method also includes after performing the circuit probe test, removing the probe pad. The method also includes after removing the probe pad, forming a bond pad and a bond via in dielectric layers over the passivation layer, the bond pad and bond via being electrically coupled to a second top metal structure of the top metal structures and a third top metal structure of the top metal structures.

Embodiments may include one or more of the following features. The method where forming bond pads and bond vias in dielectric layers over the passivation layer includes forming a first dielectric layer over the passivation layer, forming a second dielectric layer over the first dielectric layer, patterning the first and second dielectric layers to expose the second top metal structure and the third top metal structure, forming bond vias over the second and third top metal structures and in the first dielectric layer, the bond vias being electrically coupled to the second and third top metal structures, and forming a first bond pads over the bond vias and in the second dielectric layer, the first bond pads being electrically coupled to the bond vias. The first dielectric layer extends through the passivation layer and physically contacts the first top metal structure. The first dielectric layer is physically separated from the second top metal structure by the passivation layer. The method further including patterning the first interconnect structure to form a first opening exposing a portion of the first substrate, depositing a liner in the first opening, filling the first opening with a conductive material, and thinning the first substrate to expose a portion of the conductive material in the first opening, the conductive material extending through the first interconnect structure and the first substrate forming a through substrate via. The method further including direct bonding the second dielectric layer and the first bond pads to a third dielectric layer and second bond pads of a package structure, the package structure including a second substrate and a second interconnect structure over the second substrate, the third dielectric layer and the second bond pads being part of the second interconnect structure. The method further including after direct bonding the second dielectric layer and the first bond pads to the third dielectric layer and the second bond pads of the package structure, forming a first redistribution structure over the first substrate, the first redistribution structure including dielectric layers and metallization patterns therein, the metallization patterns of the first redistribution structure being electrically coupled to the through substrate via, and forming a first set of conductive bumps over and electrically coupled to the first redistribution structure. The method further including before forming the first redistribution structure, encapsulating the first substrate, the first interconnect structure, the first dielectric layer, and the second dielectric layer with an encapsulant, the first redistribution structure being formed over the encapsulant. The performing the circuit probe test further includes electrically connecting a power signal to the probe pad. The probe pad is overlapping with the second top metal structure. Removing the probe pad includes performing an etch process, the etch process removing the probe pad and exposing the first top metal structure in the first opening. The probe pad includes a solder.

An embodiment includes a method including forming a first dielectric layer over a first substrate, the first dielectric layer having a first metallization pattern therein. The method also includes forming a second dielectric layer over the first dielectric layer and the first metallization pattern. The method also includes forming a sacrificial pad over and extending through the second dielectric layer, the sacrificial pad being electrically coupled to a first conductive feature in the first metallization pattern. The method also includes performing a circuit probe test on the sacrificial pad. The method also includes after performing the circuit probe test, performing an etch process, the etch process removing the sacrificial pad. The method also includes after removing the sacrificial pad, forming a bond via in a third dielectric layer over the second dielectric layer and the first conductive feature, the third dielectric layer physically contacting the first conductive feature, the bond via being electrically coupled to a second conductive feature in the first metallization pattern. The method also includes forming a first bond pad in a fourth dielectric layer over the bond via and the third dielectric layer, the first bond pad being electrically coupled to the bond via.

Embodiments may include one or more of the following features. The method where the first bond pad and the bond via are formed by a single deposition process. The sacrificial pad is overlapping with the second conductive feature. Forming the sacrificial pad includes depositing a seed layer over and extending through the second dielectric layer, and plating a solder material on the seed layer. The method further including forming a first patterned mask over the first dielectric layer, performing an etch process using the first patterned mask as a mask, the etch process forming a first opening through the first dielectric layer and partially through the first substrate, forming a liner in the first opening, filling the first opening with a conductive material, and thinning the first substrate to expose a portion of the conductive material in the first opening, the conductive material extending through the first dielectric layer and the first substrate forming a through substrate via. The method further including direct bonding the fourth dielectric layer and the first bond pad to a fifth dielectric layer and a second bond pad of a package structure, the package structure including a second substrate.

An embodiment includes a structure including a first interconnect structure over a first substrate, the first interconnect structure including dielectric layers and metallization patterns therein. The structure also includes a through substrate via extending through the first interconnect structure and the first substrate. The structure also includes a first top metal structure and a second top metal structure in a first dielectric layer over the first interconnect structure. The structure also includes a second dielectric layer over the second top metal structure and partially over the first top metal structure. The structure also includes a third dielectric layer over the second dielectric layer, the third dielectric layer extending through the second dielectric layer to physically contact the first top metal structure. The structure also includes a bond via in the second and third dielectric layers over second top metal structure, the bond via being electrically coupled to the second top metal structure. The structure also includes a first bond pad in a fourth dielectric layer over the bond via, the first bond pad being electrically coupled to the bond via.

Embodiments may include one or more of the following features. The structure where the third dielectric layer does not physically contact the second top metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first interconnect structure over a first substrate, the first interconnect structure comprising dielectric layers and metallization patterns therein, the metallization patterns including a top metal layer including top metal structures;
   forming a passivation layer over the top metal structures of the first interconnect structure;
   forming a first opening through the passivation layer, a first top metal structure of the top metal structures being exposed through the first opening;
   forming a probe pad in the first opening and over the passivation layer, the probe pad being electrically connected to the first top metal structure;
   performing a circuit probe test on the probe pad;
   after performing the circuit probe test, removing the probe pad; and
   after removing the probe pad, forming a bond pad and a bond via in dielectric layers over the passivation layer, the bond pad and bond via being electrically coupled to a second top metal structure of the top metal structures and a third top metal structure of the top metal structures.

2. The method of claim 1, wherein forming bond pads and bond vias in dielectric layers over the passivation layer comprises:

forming a first dielectric layer over the passivation layer;

forming a second dielectric layer over the first dielectric layer;

patterning the first and second dielectric layers to expose the second top metal structure and the third top metal structure;

forming bond vias over the second and third top metal structures and in the first dielectric layer, the bond vias being electrically coupled to the second and third top metal structures; and forming first bond pads over the bond vias and in the second dielectric layer, the first bond pads being electrically coupled to the bond vias.

3. The method of claim 2, wherein the first dielectric layer extends through the passivation layer and physically contacts the first top metal structure.

4. The method of claim 2, wherein the first dielectric layer is physically separated from the second top metal structure by the passivation layer.

5. The method of claim 2 further comprising patterning the first interconnect structure to form a first opening exposing a portion of the first substrate;

depositing a liner in the first opening;

filling the first opening with a conductive material; and thinning the first substrate to expose a portion of the conductive material in the first opening, the conductive material extending through the first interconnect structure and the first substrate forming a through substrate via.

6. The method of claim 5 further comprising:

direct bonding the second dielectric layer and the first bond pads to a third dielectric layer and second bond pads of a package structure, the package structure comprising a second substrate and a second interconnect structure over the second substrate, the third dielectric layer and the second bond pads being part of the second interconnect structure.

7. The method of claim 6 further comprising after direct bonding the second dielectric layer and the first bond pads to the third dielectric layer and the second bond pads of the package structure, forming a first redistribution structure over the first substrate, the first redistribution structure comprising dielectric layers and metallization patterns therein, the metallization patterns of the first redistribution structure being electrically coupled to the through substrate via; and forming a first set of conductive bumps over and electrically coupled to the first redistribution structure.

8. The method of claim 7 further comprising:

before forming the first redistribution structure, encapsulating the first substrate, the first interconnect structure, the first dielectric layer, and the second dielectric layer with an encapsulant, the first redistribution structure being formed over the encapsulant.

9. The method of claim 1, wherein performing the circuit probe test further comprises:

electrically connecting a power signal to the probe pad.

10. The method of claim 1, wherein the probe pad is overlapping with the second top metal structure.

11. The method of claim 1, wherein removing the probe pad comprises:

performing an etch process, the etch process removing the probe pad and exposing the first top metal structure in the first opening.

12. The method of claim 1, wherein the probe pad comprises a solder.

13. A method comprising:

forming a first dielectric layer over a first substrate, the first dielectric layer having a first metallization pattern therein;

forming a second dielectric layer over the first dielectric layer and the first metallization pattern;

forming a sacrificial pad over and extending through the second dielectric layer, the sacrificial pad being electrically coupled to a first conductive feature in the first metallization pattern;

performing a circuit probe test on the sacrificial pad;

after performing the circuit probe test, performing an etch process, the etch process removing the sacrificial pad; and after removing the sacrificial pad, forming a bond via in a third dielectric layer over the second dielectric layer and the first conductive feature, the third dielectric layer physically contacting the first conductive feature, the bond via being electrically coupled to a second conductive feature in the first metallization pattern; and forming a first bond pad in a fourth dielectric layer over the bond via and the third dielectric layer, the first bond pad being electrically coupled to the bond via.

14. The method of claim 13, wherein the first bond pad and the bond via are formed by a single deposition process.

15. The method of claim 13, wherein the sacrificial pad is overlapping with the second conductive feature.

16. The method of claim 13, wherein forming the sacrificial pad comprises;

depositing a seed layer over and extending through the second dielectric layer; and plating a solder material on the seed layer.

17. The method of claim 13 further comprising:

forming a first patterned mask over the first dielectric layer;

performing an etch process using the first patterned mask as a mask, the etch process forming a first opening through the first dielectric layer and partially through the first substrate;

forming a liner in the first opening;

filling the first opening with a conductive material; and thinning the first substrate to expose a portion of the conductive material in the first opening, the conductive material extending through the first dielectric layer and the first substrate forming a through substrate via.

18. The method of claim 13 further comprising:

direct bonding the fourth dielectric layer and the first bond pad to a fifth dielectric layer and a second bond pad of a package structure, the package structure comprising a second substrate.

* * * * *